United States Patent
Classen

(10) Patent No.: US 11,274,038 B2
(45) Date of Patent: Mar. 15, 2022

(54) METHOD FOR SETTING A PRESSURE IN A CAVERN FORMED WITH THE AID OF A SUBSTRATE AND OF A SUBSTRATE CAP, SEMICONDUCTOR SYSTEM, IN PARTICULAR, WAFER SYSTEM

(71) Applicant: Robert Bosch GmbH, Stuttgart (DE)

(72) Inventor: Johannes Classen, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 129 days.

(21) Appl. No.: 16/700,391

(22) Filed: Dec. 2, 2019

(65) Prior Publication Data
US 2020/0180947 A1   Jun. 11, 2020

(30) Foreign Application Priority Data
Dec. 6, 2018 (DE) .................... 102018221108.6

(51) Int. Cl.
*B81C 1/00* (2006.01)
*B81B 7/04* (2006.01)

(52) U.S. Cl.
CPC ............ *B81C 1/00293* (2013.01); *B81B 7/04* (2013.01); *B81B 2203/0315* (2013.01); *B81C 2203/0118* (2013.01); *B81C 2203/0785* (2013.01)

(58) Field of Classification Search
CPC .................. B81C 1/00285; B81C 1/00293
See application file for complete search history.

(56) References Cited

U.S. PATENT DOCUMENTS

2017/0050841 A1*  2/2017  Liu ..................... B81C 1/00293

FOREIGN PATENT DOCUMENTS

DE   102005001449 B3   7/2006
DE   102014202801 A1   8/2015

\* cited by examiner

*Primary Examiner* — Moazzam Hossain
(74) *Attorney, Agent, or Firm* — Norton Rose Fulbright US LLP; Gerard Messina

(57) ABSTRACT

A method for setting a pressure in a cavern formed using a substrate and a substrate cap, the cavern being part of a semiconductor system, including an additional cavern formed with using the substrate and of the substrate cap, a microelectromechanical system being situated in the cavern, an additional microelectromechanical system being situated in the additional cavern, a diffusion area being situated in the substrate and/or in the substrate cap, the method includes a gas diffusing with the aid of the diffusion area from the surroundings into the cavern, during the diffusing, a diffusivity and/or a diffusion flow of the gas from the surroundings into the cavern being greater than an additional diffusivity and/or an additional diffusion flow of the gas from the surroundings into the additional cavern, and/or during the diffusing, the additional cavern being at least essentially protected from a penetration of the gas into the additional cavern.

24 Claims, 19 Drawing Sheets

METHOD FOR SETTING A PRESSURE IN A CAVERN FORMED WITH THE AID OF A SUBSTRATE AND OF A SUBSTRATE CAP, SEMICONDUCTOR SYSTEM, IN PARTICULAR, WAFER SYSTEM

CROSS REFERENCE

The present application claims the benefit under 35 U.S.C. § 119 of German Patent Application No. DE 102018221108.6 filed on Dec. 6, 2018, which is expressly incorporated herein by reference in its entirety.

FIELD

The present invention relates to a method for setting a pressure in a cavern formed with the aid of a substrate and of a substrate cap, the cavern being part of a semiconductor system, in particular, of a wafer system. The present invention further relates to a semiconductor system, in particular, a wafer system, including a cavern formed with the aid of a substrate and of a substrate cap.

BACKGROUND INFORMATION

In semiconductor technology, microelectromechanical systems (MEMS), in particular, sensors, are situated in caverns or cavities. The aim in this case is to form a working pressure or operating pressure in the caverns for the MEMS, which ensures a preferably optimal operation of the corresponding MEMS. Such MEMS may be designed, for example, for measuring accelerations, rotation rates, magnetic fields or, if necessary, for pressures and are mass-produced for various applications in the automobile sector and consumer sector.

There are various conventional techniques for adjusting the pressure in a cavern for a particular sensor. In resealing techniques, the cavern is opened after the wafer bonding (or sealing with the aid of a thin layer cap technology), a suitable internal pressure is set and the cavern is subsequently sealed again. The sealing may take place, for example, via a thin layer deposition or via a laser seal (see, e.g., German Patent Application No. DE 10 2014 202 801 A1), in which a surrounding area close to the surface is melted around an access hole by locally introducing heat with the aid of a laser.

Conventionally, gas particles may have a certain permeability through material layers, i.e., that they are able to diffuse through particular solid bodies. The diffusion effect or leakage gas flow is proportional to the partial differential pressure, to the cross sectional area of the surface acted upon by the gas and inversely proportional to the thickness of the material layer. It is further greatly (in particular, exponentially) a function of temperature, i.e., it is significantly more pronounced at high temperatures than at ambient temperature. In this regard, German Patent No. DE 10 2005 001 449 B3 describes that in a semiconductor component having a semiconductor oxide area between a cavity and an outer surface of the semiconductor component, the semiconductor oxide area may be used as a type of valve for admitting a particular inert gas in order to achieve a predefined internal pressure.

In order to improve the efficiency and functionality of MEMS, a cost reduction and the further miniaturization of the component, in particular, in consumer electronics, are urgent. An increase of the integration density (i.e., implementation of more functionality in the same installation space) of MEMS sensors is therefore desirable. More recently, for example, rotation rate sensors and acceleration sensors are increasingly situated on a shared chip for this purpose.

One of the challenges when combining different sensors on a shared chip, for example, when combining rotation rate sensors and acceleration sensors, lies in the different optimal operating pressures of the sensors.

SUMMARY

An object of the present invention is to provide a method for setting a pressure in a cavern formed with the aid of a substrate and of a substrate cap, the cavern being part of a semiconductor system, in particular, a wafer system, which allows for an efficient, flexible and/or cost-efficient increase of the integration density.

An example method according to the present invention for setting a pressure in a cavern formed with the aid of a substrate and of a substrate cap may have the advantage over the related art that it is possible with the aid of a diffusion step to form different pressures or internal pressures in one cavern and in an additional cavern of a semiconductor system. According to the present invention, a gas diffusion into the cavern may take place with the aid of the diffusion area, which is increased as compared to the diffusion in the additional cavern. In this way, a cost-efficient and reliable pressure setting is possible for different MEMS, as a result of which it is possible to particularly advantageously increase the integration density.

According to the present invention, only a very small additional surface or no additional surface of the chip is advantageously required for forming the diffusion access.

In addition, potentially invasive techniques, such as laser reseals, may be dispensed with. The risk of smoke may be reduced as a result. Furthermore, no undesirable topography is formed, as is typically the case with laser reseal processes.

According to the present invention, the fact that the additional cavern is at least essentially protected during the diffusion step from a penetration of the gas into the additional cavern may be understood to mean, in particular, that compared to the diffusion into the cavern, no diffusion or significantly less diffusion into the additional cavern takes place.

The diffusivity (or the diffusion flow or the diffusion rate) into the cavern is preferably at least 25 times, particularly preferably at least 50 times, greater than the additional diffusivity (or the additional diffusion flow or the additional diffusion rate) into the additional cavern. Thus, for example, at a ratio of the diffusion rates of 1:100, it is possible to set an internal pressure of 0.5 mbar in the additional cavern and an internal pressure of 50 mbar in the cavern.

According to the present invention, it is advantageously possible that the microelectromechanical system and the additional microelectromechanical system are designed as different types of MEMS. The MEMS and the additional MEMS have, in particular, different optimal working pressures. For example, the microelectromechanical system may be an acceleration sensor and the additional microelectromechanical system may be a rotation rate sensor.

Ideally, a rotation rate sensor is operated typically between 0.1 mbar and 2 mbar in a solid vacuum, whereas an acceleration sensor should be at least critically damped. An acceleration sensor is therefore operated typically at internal pressures on the order of 100 mbar or more, generally 30 mbar to 1000 mbar.

It is therefore advantageous for the simultaneous operation of rotation rate sensor and acceleration rate sensor on one chip to form two separate cavern volumes having different internal pressures in one hermetically sealed chip.

According to the present invention, the gas may preferably be neon. Other types of gas such as helium or hydrogen or gas mixtures are also possible, however. It should advantageously be a gas or gas mixture, which has a relatively high permeability through the material of the diffusion area, in particularly through an oxide.

When using neon, it is necessary to advantageously set only a comparatively low internal pressure in a cavern due to the high viscosity in order to achieve a good damping effect.

During the diffusion step, the semiconductor system is exposed, in particular, to a gas atmosphere, in particular, a neon gas atmosphere, at increased temperatures of several 100° C. (and preferably to increased pressure). Under such conditions, the gas atoms are able to diffuse into the interior of the cavern with the aid of the diffusion area.

The object of the present invention may also achieved by an example method for setting a pressure in a cavern formed with the aid of a substrate and of a substrate cap, the cavern being part of a semiconductor system, in particular, a wafer system, the semiconductor system including an additional cavern with the aid of the substrate and of the substrate cap, a microelectromechanical system being situated in the cavern, an additional microelectromechanical system being situated in the additional cavern, a diffusion area being situated in the substrate and/or in the substrate cap, the method including at least the following diffusion step:

- a gas diffuses in the diffusion step with the aid of the diffusion area from the cavern into the surroundings,
- during the diffusion step, a diffusivity and/or a diffusion flow of the gas from the cavern into the surroundings being greater than an additional diffusivity and/or an additional diffusion flow of the gas from the additional cavern into the surroundings, and/or
- during the diffusion step, the additional cavern being at least essentially protected from an escape of the gas into the surroundings. The method has the advantage that with the aid of the diffusion step, it is possible to form different pressures or internal pressures in the cavern and in the additional cavern of the semiconductor system. According to the present invention, in particular, a diffusion from the cavern may take place, which is increased as compared to the diffusion from the additional cavern. In this way, a cost-efficient and reliable pressure setting for different MEMS is possible, as a result of which it is possible to particularly advantageously increase the integration density. Potentially invasive techniques, such as laser reseals, may, in particular, be advantageously dispensed with.

Advantageous refinements and specific embodiments result from the description herein of the present invention.

Because the diffusion area includes an oxide, the diffusion area being made up, in particular, of an oxide, it is advantageously possible according to one specific embodiment of the present invention to enable an efficient diffusion of a gas into the cavern with the aid of the diffusion area.

Because the diffusion area continuously connects the cavern at least during the diffusion step with a substrate surface facing the surroundings and/or with a substrate cap surface facing the surroundings, it is possible according to one specific embodiment of the present invention to provide a diffusion area having particularly accurately definable properties for the cavern. The diffusion properties in this case may be set, in particular, by the geometry of the diffusion area.

Because a recess is produced in a previous step before the diffusion step in the substrate on a substrate surface facing the surroundings and/or in the substrate cap on a substrate cap surface facing the surroundings, the recess extending up to the diffusion area and, in particular, exposing the diffusion area, it is possible according to one specific embodiment of the present invention to particularly precisely and reproducibly set the diffusion properties. With the aid of the recess, it is possible, in particular, to define an interface of the diffusion area, at which an entry of gas atoms is possible. The size of this interface has a direct influence on the diffusion flow during the diffusion step.

Because the previous step takes place during an etching step for producing a through silicon via (TSV), the recess, in particular, being produced during the etching step for producing a through silicon via, it is possible according to one specific embodiment of the present invention, to design the recess in a particularly cost-saving manner. As a result, it is advantageously possible to dispense with the inclusion of a separate process step for producing the recess in the manufacturing process.

Because an electrical insulation of the through silicon via is formed with the aid of the recess, it is possible according to one specific embodiment of the present invention to design a particularly space-saving and efficient recess for exposing the diffusion area, which at the same time contributes to the insulation of a via.

Alternatively, it is possible according to the present invention that the recess is a recess separate from the production and insulation of the via which, if necessary, is nevertheless produced in the same etching step.

According to the present invention, an advantageous combination with TSV load approaches is accordingly possible. In this case, both MEMS-TSVs (in the substrate) as well as ASIC-TSVs (in the substrate cap) are possible. In both cases, it is possible that the trenches/recesses required when creating the TSVs are utilized by the MEMS wafer or ASIC wafer as a gas access and the oxide layers only a few micrometers in thickness in the MEMS wafer or ASIC wafer are utilized as a diffusion layer or diffusion area. For both TSV types, a gas-tight seal is then possible with no additional effort in the process, so that the back-diffusion of neon from the cavern is effectively prevented.

Because a channel is formed in the substrate or in the substrate cap adjacent to the diffusion area, in particular, the gas passing from the surroundings into the cavern or passing from the cavern into the surroundings in the diffusion step with the aid of the diffusion area, it is possible according to one specific embodiment of the present invention that an open channel is provided in addition to the diffusion area, which increases the rate of penetration into the cavern (or the rate of escape from the cavern) during the diffusion step. Particularly high diffusion rates may be enabled as a result.

Because the substrate cap is designed as an application-specific integrated circuit wafer, ASIC wafer, it is possible according to one specific embodiment of the present invention that an advantageously particularly space-saving and functional arrangement may be provided.

Because the diffusion area is formed in one or multiple diffusion layers, in particular, in one or more oxide layers, of the substrate or of the substrate cap, it is possible according to one specific embodiment of the present invention to provide a particularly advantageous design of the diffusion area.

Because the diffusion layer or the multiple diffusion layers includes/include a diffusion stop barrier, the diffusion stop barrier, in particular, at least essentially protecting the additional cavern during the diffusion step from the penetration of the gas into the additional cavern or from the escape of the gas from the additional cavern, it is possible according to one specific embodiment of the present invention that the additional cavern is at least partially protected in the diffusion step from a penetration of the gas (or from an escape of the gas) with the aid of the diffusion stop barrier. In this case, it is possible, in particular, that the diffusion layer or the multiple diffusion layers also borders/border the additional cavern, but are interrupted with the aid of the diffusion stop barrier. The diffusion stop barrier may, for example, be produced from silicon or from a metal.

Alternatively or in addition, it is possible that the diffusion layer does not border the additional cavern and, in this way, a penetration (or escape) of the gas in the diffusion step into the additional cavern is at least essentially prevented.

Alternatively, it is possible that the diffusion layer or the diffusion layers borders/border the additional cavern (and no diffusion stop barrier is present, which protects the additional cavern). Instead, the diffusion layer is formed in such a way that a diffusion path (formed with the aid of the diffusion area) from the surroundings into the cavern exhibits a (significantly) greater diffusivity than an additional diffusion path from the surroundings into the additional cavern. Thus, the parameters determining the gas diffusion in the diffusion step may be set in such a way that a sufficient gas diffusion into the cavern takes place and that, at the same time, a diffusion into the additional cavern takes place which is significantly lower in comparison.

Because a separation substep is carried out at least partially before the diffusion step, a trench being produced in the substrate and/or the substrate cap during the separation substep, and in particular, before the diffusion step, the trench extending at least to the diffusion area and/or at least to the diffusion layer, the trench preferably fully penetrating at least the substrate or the substrate cap, it is possible according to one specific embodiment of the present invention that the filling of the cavern with gas is carried out as part of the separation of a wafer and may thus be efficiently and cost-efficiently integrated into the manufacturing process. During the separation, the wafer is divided into individual chips, in particular, with the aid of a sawing process. In this sawing process, the trench that exposes the diffusion area is produced. The separation of the wafer system in this case is preferably not fully carried out before the diffusion step, i.e., substrate and substrate cap are thus preferably not completely sawed before the diffusion step. Instead, a stop is made at a certain depth of the trench and the diffusion step is subsequently carried out. The separation is then completed after the diffusion step. According to the present invention, it is particularly preferred that the cavern and the additional cavern are situated on one single finished chip, which therefore includes the MEMS and the additional MEMS. If necessary, the chip may also include still other MEMS and corresponding caverns.

Because the diffusion area and/or a recess extending to the diffusion area is/are sealed in the substrate or in the substrate cap with a diffusion protection in an additional step, after the diffusion step, it is possible according to one specific embodiment of the present invention to particularly advantageously protect the cavern from a pressure change during the subsequent operation and over the service life of the components. Thus, a direct covering may take place, as well as one or multiple additional layers may be situated on the diffusion area or on the recess before the application of the diffusion protection. Alternatively, it is possible that the diffusion area is designed in such a way (with respect to the material used and its geometry) that though the necessary diffusion into the cavern is possible during the diffusion step, barely any pressure change or no significant pressure change takes place after the diffusion step in the subsequent operation of the MEMS. This is possible as a result of the diffusion step being able to take place at an increased temperature and under a predefined, in particular, increased gas pressure in the surroundings.

With suitable dimensioning of the diffusion area or of the design of multiple diffusion areas, it is possible according to the present invention that more than two caverns may be filled with different gas pressure. For example, a cavern of a rotation rate sensor may be filled with a very low internal pressure $p1<1$ mbar (as set during wafer bonding), a cavern of a pressure sensor may be filled with an average internal pressure $p2\sim10$ mbar and a cavern of an acceleration sensor may be filled with a high internal pressure $p3\sim100$ mbar. The cavern of the rotation rate sensor in this case includes, for example, no diffusion area, the pressure sensor includes a small-surface (or thick) diffusion area and the acceleration sensor includes a large-surface (or thin) diffusion area. As a result, it is possible according to the present invention, by adapting the geometries, to create with no appreciable additional effort an entire series of different internal pressures in caverns separated from one another.

An additional subject matter of the present invention is a semiconductor system, in particular, a wafer system, including a cavern formed with the aid of a substrate and of a substrate cap and an additional cavern formed with the aid of the substrate and of the substrate cap, a microelectromechanical system being situated in the cavern, an additional microelectromechanical system being situated in an additional cavern, a diffusion area being situated in the substrate and/or in the substrate cap, the diffusion area being formed in such a way that a diffusion of a gas may be carried out from the surroundings into the cavern with the aid of the diffusion area, a diffusivity and/or a diffusion flow of the gas from the surroundings into the cavern being greater than an additional diffusivity and/or an additional diffusion flow of the gas from the surroundings into the additional cavern, and/or the additional cavern being at least essentially protected from a penetration of the gas into the additional cavern.

Still another subject matter of the present invention is a semiconductor system, in particular, a wafer system, including a cavern formed with the aid of a substrate and/or a substrate cap, and an additional cavern formed with the aid of the substrate and of the substrate cap, a microelectromechanical system being situated in the cavern, an additional microelectromechanical system being situated in the additional cavern, a diffusion area being situated in the substrate and/or in the substrate cap, the diffusion area being formed in such a way that a diffusion of a gas from the cavern into the surroundings may be carried out with the aid of the diffusion area, a diffusivity and/or a diffusion flow of the gas from the cavern into the surroundings being greater than an additional diffusivity and/or an additional diffusion flow of the gas from the additional cavern into the surroundings, and/or the additional cavern being at least essentially protected from an escape of the gas from the additional cavern.

The features, designs and advantages, which have been described in conjunction with the method according to the present invention or in conjunction with a specific embodiment of the method according to the present invention, may be used for the semiconductor systems according to the present invention. Exemplary embodiments of the present invention are depicted in the figures and explained in greater detail in the description below.

DETAILED DESCRIPTION OF EXAMPLE EMBODIMENTS

Figure 1:
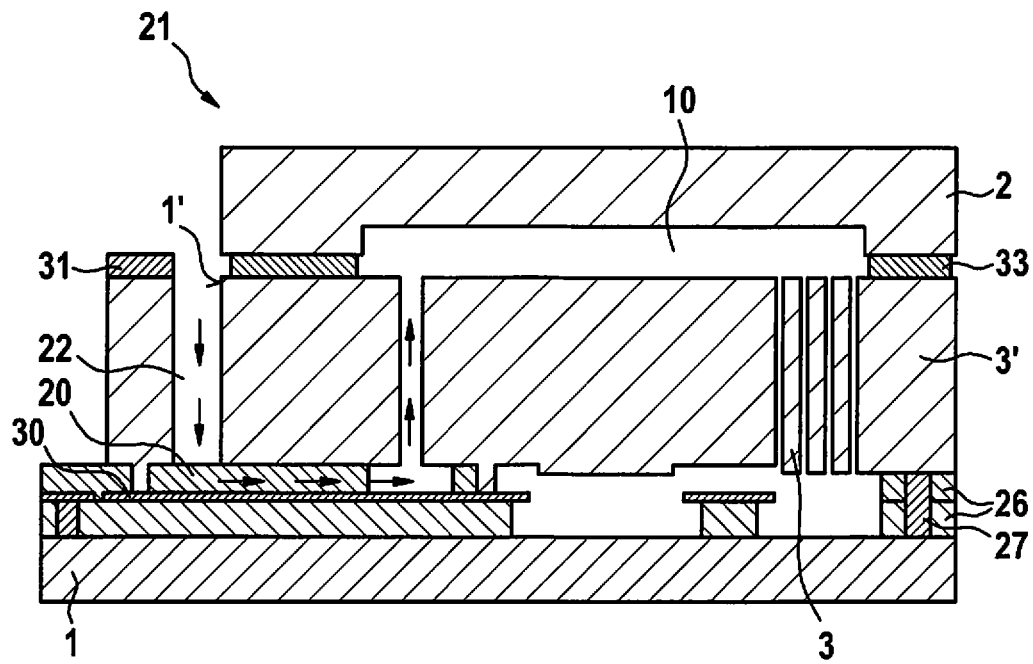
FIG. 1 shows a schematic representation of a subarea of a semiconductor system, in particular, of a wafer system, according to one specific embodiment of the present invention.

Identical parts in the various figures are always provided with the same reference numerals and are therefore generally each also named or mentioned only once.

FIG. 1 shows a schematic representation of a subarea of a semiconductor system, in particular, of a wafer system, according to one specific embodiment of the present invention. The system includes a substrate 1 and a substrate cap 2. Substrate 1 and substrate cap 2 are connected to one another by a bonding frame 33 in such a way that a cavern 10 or a cavity 10 is formed. Situated in cavern 10 is a microelectromechanical system 3, which is formed at least partially in MEMS functional layer 3'. According to the present invention, an additional cavern 6 including an additional microelectromechanical system 7 is also present, which are not depicted in FIG. 1. Additional cavern 6 may, for example, be situated to the right next to depicted cavern 10.

One or multiple diffusion layers 26 are situated below MEMS functional layer 3'. These may be designed as multiple sublayers or as one continuous layer. Diffusion layer(s) 26 typically include an oxide. Diffusion area 20 is formed as part of the diffusion layer(s). Diffusion area 20 connects the interior of cavern 10 to surroundings 21 or to substrate surface 1' facing surroundings 21. For this purpose, a recess 22 is present in MEMS functional layer 3' of substrate 1, which exposes diffusion area 20 to the outside. A bonding pad 31, including an aluminum layer for electrically contacting microelectromechanical system 3, is situated adjacent to recess 22 and outside the cap area with the aid of a wire bond. Bonding pad 31 is connected via strip conductor plane 30 to components of microelectromechanical system 3 in an electrically conductive manner. In a diffusion step, a gas, preferably neon, diffuses through diffusion area 20 from surroundings 21 into cavern 10. This diffusion is schematically depicted in FIG. 1 by the arrows, starting from recess 22 via diffusion area 20 into the interior of cavern 10. During the diffusion step, the diffusivity and/or the diffusion flow of the gas from surroundings 21 into cavern 10 is greater than an additional diffusivity and/or an additional diffusion flow of the gas from surroundings 21 into additional cavern 6 not depicted in FIG. 1. It is possible that additional cavern 6 is at least essentially protected during the diffusion step from a penetration of the gas into additional cavern 6. For this purpose, diffusion stop barrier 27, among other things, is formed in diffusion layers 26 between cavern 10 and additional cavern 6 not depicted. In this way, it is possible to prevent a diffusion of the gas from cavern 10 into additional cavern 6. During the diffusion step, the semiconductor system is exposed to a gas atmosphere, in particular, to a neon gas atmosphere, at increased temperatures of several 100° C. Under such conditions, the gas atoms are able to diffuse into the interior of cavern 10 with the aid of diffusion area 20. The diffusion path in this case is relatively long (typical widths of bonding frame 33 are on the order of 100 μm), so that the diffusion process progresses more slowly, since the diffusion rate is inversely proportional to the path length in diffusion area 20 or in the oxide.

Figure 2:
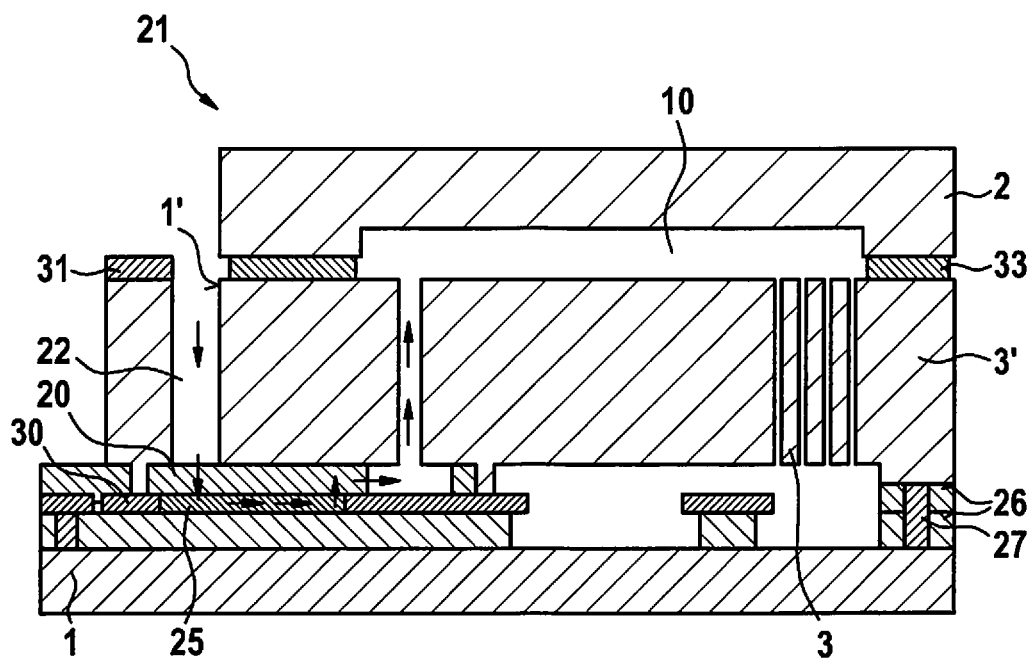
FIG. 2 shows a schematic representation of a subarea of a semiconductor system, in particular, of a wafer system, according to one specific embodiment of the present invention.

FIG. 2 shows a schematic representation of a subarea of a semiconductor system, in particular, of a wafer system, according to one specific embodiment of the present invention. The specific embodiment depicted in FIG. 2 corresponds to the specific embodiment depicted in FIG. 1 with the following differences. In contrast to the specific embodiment depicted in FIG. 1, a channel 25 is formed in substrate 1 in the specific embodiment depicted in FIG. 2 adjacent to diffusion area 20. In the diffusion step, the gas penetrates with the aid of diffusion area 20 and of channel 25 from surroundings 21 into cavern 10. For this purpose, channel 25 includes, in particular, a hollow core area that facilitates the gas flow. Typically, multiple such channels 25 are present. The diffusion path in the oxide is shortened significantly as a result of these small open channels 25.

Such channels 25 may be formed in various ways, according to the specific embodiment depicted in FIG. 2, for example, by trenching a narrow trench in silicon, for example, in strip conductor plane 30, and subsequent oxide deposition. The trench may then be sealed with oxide due to the high deposition rate on the trench upper side before it is completely back-filled to the bottom with oxide. This forms (hollow) channel 25, through which gases are able to diffuse nearly unimpeded.

Figure 3:
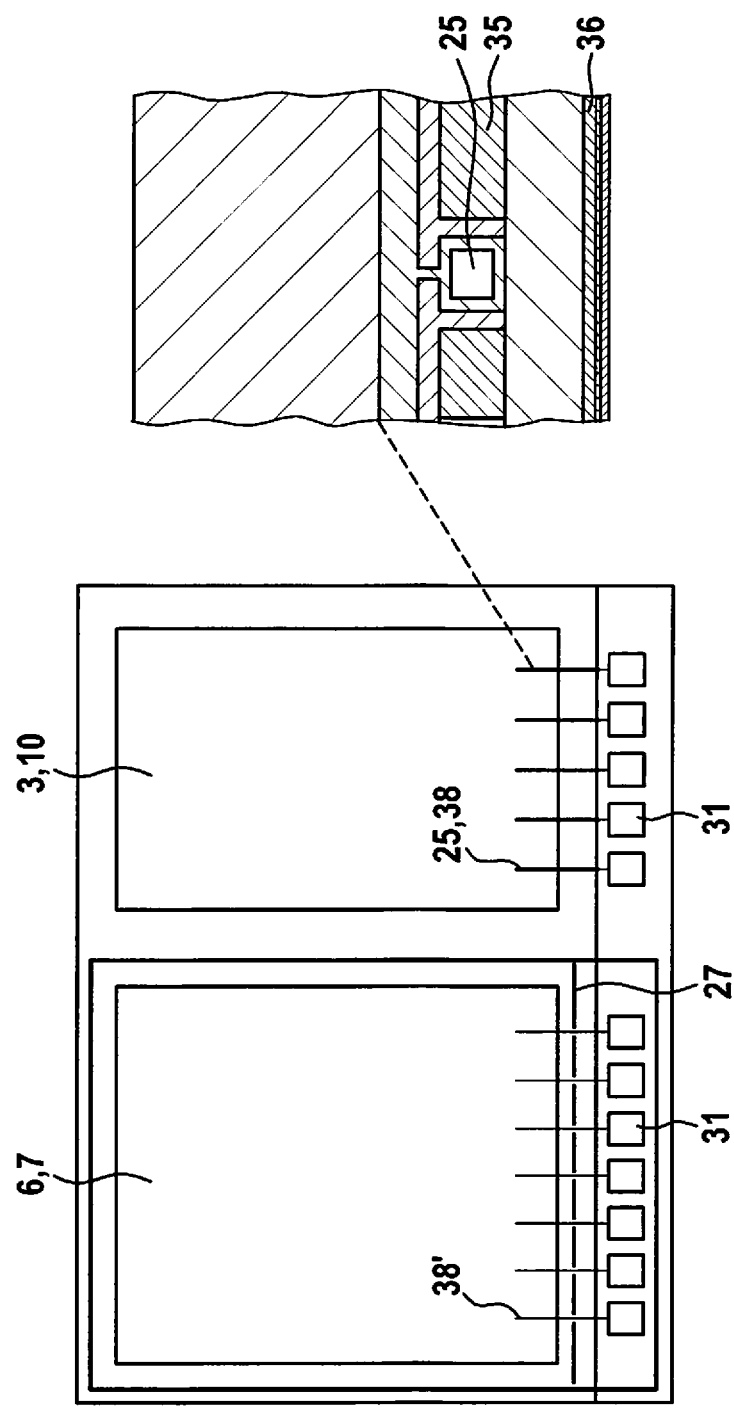
FIG. 3 shows a schematic representation of a semiconductor system, in particular, of a wafer system, according to one specific embodiment of the present invention.

An alternative form of the channel formation is depicted in the right partial image of FIG. 3. In this case, a relatively large (etched) channel 25 is created by structuring polysilicon layer 35 twice and depositing and structuring multiple oxide layers. FIG. 3 shows a schematic representation of a semiconductor system, in particular, of a wafer system, according to one specific embodiment of the present invention. In this case, the left portion of FIG. 3 shows a schematic top view of the semiconductor system. Cavern 10 including microelectromechanical system 3 and additional cavern 6 including additional microelectromechanical system 7 are depicted. Microelectromechanical system 3 is electrically connected via strip conductors 38, including etched channels 25 in polysilicon layer 35, to bonding pads 31 for wire bonding. Additional cavern 6 is surrounded at least partially by a diffusion stop barrier 27. Additional microelectromechanical system 7 is connected to additional bonding pad 31 with the aid of additional strip conductors 38', which are situated in the lower wiring plane 36. Diffusion stop barrier 27 includes breaks for guiding through additional strip conductors 38'. A corresponding schematic cross section through a layer system of substrate 1 is shown in the right portion of the figure.

As is depicted in FIGS. 2 and 3, it is possible to greatly increase the diffusion rate into the cavern interior of a MEMS element via the local formation of gas channels 25. In this way, it is particularly advantageously possible to set two different cavern pressures for MEMS elements 3, 7 combined on one chip, for example, for a combined rotation rate sensor and acceleration sensor, with the aid of different gas diffusion into the two separate caverns 10, 6.

For this purpose, the semiconductor system is acted upon during wafer bonding with a very low gas pressure or vacuum so that a very low internal pressure is initially formed in both caverns 10, 6, which is optimal, for example, for the operation of the rotation rate sensor.

Subsequently, the wafer is exposed at increased temperatures to a gas atmosphere, preferably a neon atmosphere. In the process, a rapid gas diffusion into cavern 10 of the acceleration sensor takes place, since here only very short paths need to be passed through by an oxide of diffusion area 20. The diffusion path between bonding pads 31 and the cavern interior in these specific embodiments is greatly shortened as a result of channels 25, which preferably run in parallel to the strip conductors. In addition, the bonding frame includes no diffusion stop barrier in the area of microelectromechanical system 3. Additional cavern 6 of additional microelectromechanical system 7 on the other hand is protected from the inward diffusion of neon with the aid of diffusion stop barrier 27. In the specific embodiment depicted in FIG. 3, diffusion stop barrier 27 (of additional cavern 6) is interrupted merely in the immediate surroundings of the strip conductor guides. The oxide entry areas into additional cavern 6 accessible to neon atoms are therefore very small, in addition, the diffusion paths are preferably very long. Accordingly, it is advantageously possible to allow for a very high ratio of the neon diffusion between both caverns 10, 6.

The ratio of the diffusion rates into both caverns 6, 10 may be particularly preferably set to values of 1:50 or even less, so that, for example, at a ratio of 1:100, an internal pressure of 0.5 mbar is settable in additional cavern 6, but 50 mbar in cavern 10.

In FIGS. 1 through 3, the gas diffusion in substrate 1 takes place essentially below the bonding frame, starting from the bonding path area, since oxide areas are exposed only in the surroundings of bonding pad 31 with the aid of recess 20 in the wafer composite. The remaining three sides of the chip are delimited by neighboring chips, so that only non-permeable silicon surfaces are exposed (in particular the upper side of the substrate cap 2 and the underside of the MEMS substrate 1).

Figure 4:
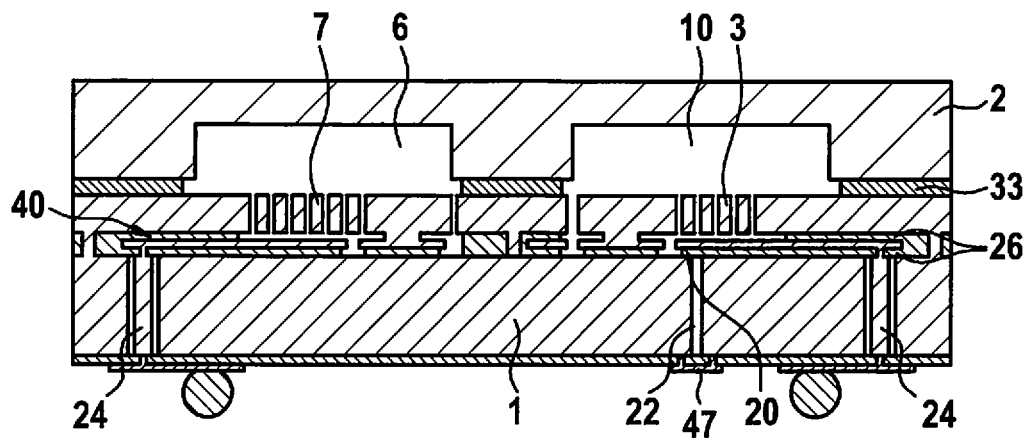
FIG. 4 shows a schematic representation of a semiconductor system, in particular, of a wafer system, according to one specific embodiment of the present invention.

FIG. 4 shows a schematic representation of a semiconductor system, in particular, of a wafer system, according to one specific embodiment of the present invention. In contrast to the specific embodiments depicted in FIGS. 1 through 3, airgap through silicon via 24 (airgap-through silicon via, TSV) are created in substrate 1 in the specific embodiment shown in FIG. 4. Bonding pads 31 may be dispensed with as a result. At the same time, a recess 22 in the form of a trench may be formed as a gas channel through substrate 1 or through a part of substrate 1 for insulating through silicon via 24 using the trenching process. Recess 22 for exposing diffusion area 20 in the specific embodiment depicted in FIG. 4 is, in particular, a recess different from the insulation of through silicon via 24. This recess 22 also stops at the lowest diffusion layer 26 in substrate 1 or MEMS wafer. Recess 22 extends, in particular, to diffusion area 20. Thus, a very short diffusion path into the interior of cavern 10 is formed as a result of diffusion area 20. On the other hand, a significantly longer diffusion path 40 through the silicon dioxide of diffusion layers 26 exists for additional cavern 6. As a result of the greatly increased length of diffusion path 40, only a very minimal gas diffusion or no notable gas diffusion into additional cavern 6 takes place in a diffusion step, whereas the significantly shorter diffusion path through diffusion area 20 into cavern 10 facilitates the intended (greater) diffusion. Accordingly, the diffusivity and the diffusion flow of the gas from surroundings 21 into cavern 10 during the diffusion step are greater than the additional diffusivity and the additional diffusion flow of the gas from surroundings 21 into additional cavern 6. According to some specific embodiments of the present invention, it is possible that a diffusion protection 47 is formed by a metal deposition in the area of recesses 22, which effectively prevents a back-diffusion of neon out of the component.

Figure 5:
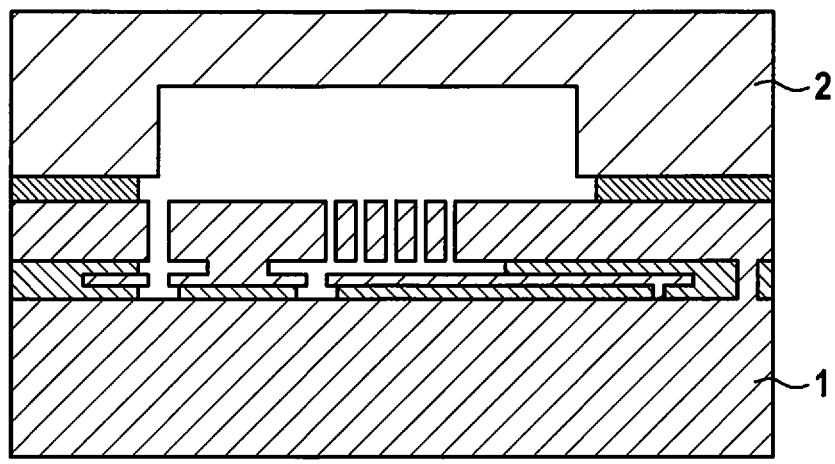
FIGS. 5, 6, 7 and 8 schematically show process steps for manufacturing the specific embodiment of a semiconductor system depicted in FIG. 4 according to one specific embodiment of the present invention.
Figure 6:
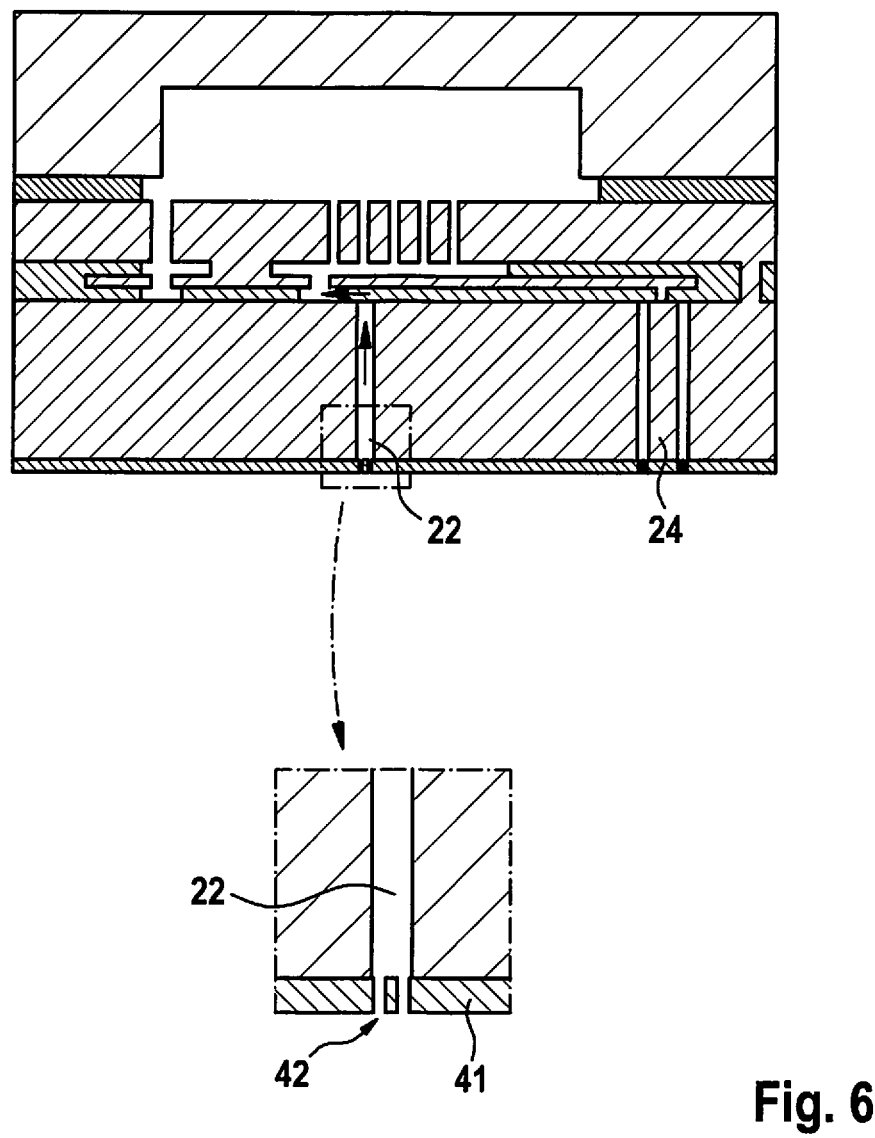

FIGS. 5, 6, 7 and 8 schematically show process steps for manufacturing the specific embodiment of a semiconductor system depicted in FIG. 4 according to one specific embodiment of the present invention. Only the right half of the chip from FIG. 4 is depicted. FIG. 5 shows substrate 1 and substrate cap 2 after bonding. FIG. 6 depicts the formation of an oxide lattice on the rear side of substrate 1 with the aid of an oxide deposition 41 and structuring 42. A recess 22 is produced in substrate 1 with the aid of the oxide lattice during the etching step for producing the insulation trenches of through silicon vias 24. Cavern 10 is subsequently filled with neon with the aid of diffusion through the oxide in diffusion area 20 at increased temperatures. The very short diffusion path through diffusion area 20 of, in particular, only a few micrometers, is depicted by the arrows. It is possible that no vias 24 are situated in the area of additional cavern 6, so that no entry area for the gas in the diffusion step into additional cavern 6 is present. Alternatively, an advantageous geometric design may allow the effective diffusion paths in the area of vias 24 to be sufficiently long as compared to the diffusion paths through diffusion area 20, starting from recess 22 (as depicted in FIG. 4). It is advantageously possible that the number and/or area of recesses 22 are selected to be comparatively large in order to increase the diffusion rates through diffusion area 20 as compared to the diffusion in the area of through silicon vias 24.

Figure 7:
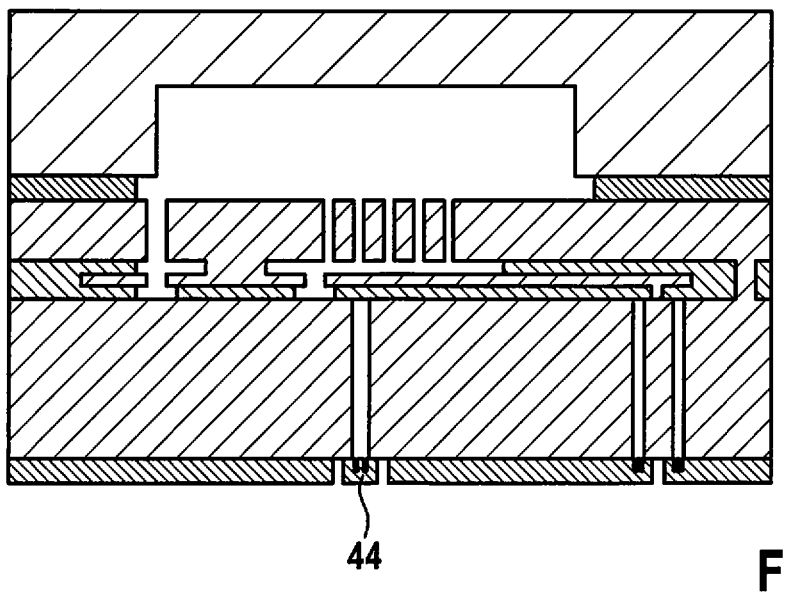
Figure 8:
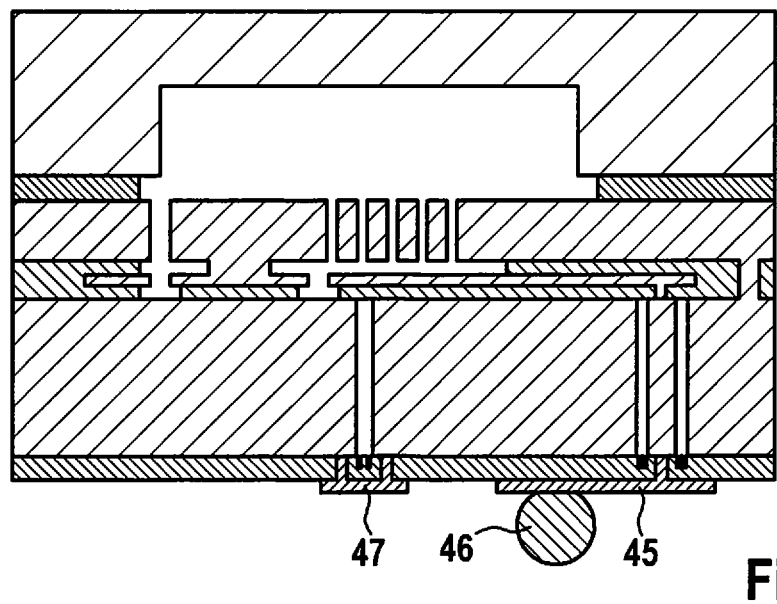

Because cavern 10 is filled with the aid of diffusion area 20, and no direct diffusionless access to cavern 10 is formed, an oxide seal 44 may advantageously take place in the step depicted in FIG. 7 at optimum values for gas pressure and temperature without consideration given to an internal pressure to be maintained in cavern 10, which would not be possible in a still unsealed or open cavern (with no diffusion access). This yields advantages in the batch processing of a multitude of wafers, so that the subsequent processes shown in FIG. 7 may be more efficiently and more flexibly carried out. FIG. 8 shows that a metal is deposited and structured as redistribution plane 45. It is subsequently possible that additional passivation layers, an under bump metal (UBM) and solder balls 46 may be situated for electrically contacting the component or MEMS. According to some specific embodiments of the present invention, it is possible that a back-diffusion of neon out of cavern 10 is effectively prevented by a metal deposition in the area of recesses 22 (or gas channels 22) as diffusion protection 47. This is particularly advantageous if the component is exposed to significantly increased temperatures for longer periods of time during operation.

Figure 9:
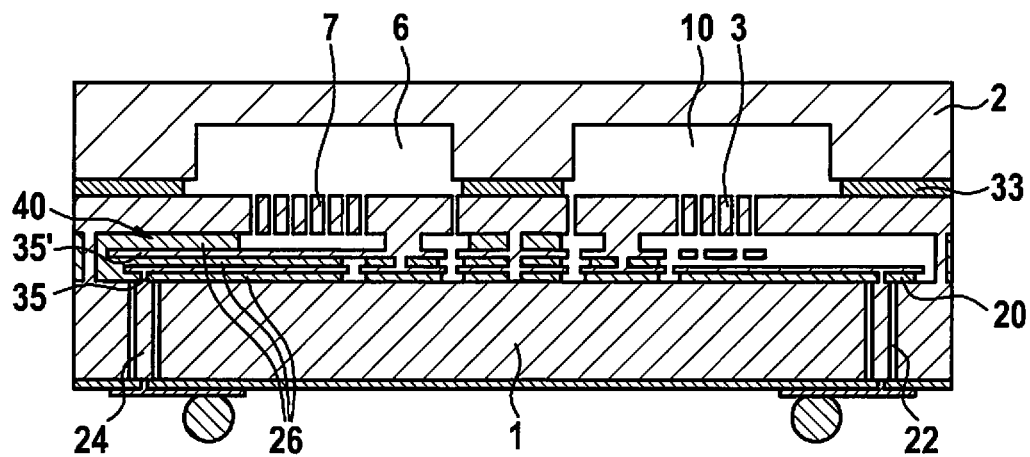
FIG. 9 shows a schematic representation of a semiconductor system, in particular, of a wafer system, according to one specific embodiment of the present invention.

FIG. 9 shows a schematic representation of a semiconductor system, in particular, of a wafer system, according to one specific embodiment of the present invention. In contrast to the specific embodiment depicted in FIG. 4, the formation of dedicated etch trenches or gas channels for the gas diffusion is dispensed with in the specific embodiment shown in FIG. 9. Instead, recess 22, which exposes diffusion area 20, is formed as part of the insulation of through silicon via 24 in the area of cavern 10. In this case, the layout of the surface micromechanical layers, in particular, of diffusion layers 26, in the area of TSVs 24, ensures that in the area of cavern 10 diffusion paths (through diffusion area 20) are present, which are significantly shorter than in the area of additional cavern 6. Accordingly, diffusion path 40 into additional cavern 6 in FIG. 9 is significantly longer than the diffusion path through diffusion area 20 into cavern 10. It may be particularly advantageous in this case that the sensor substructure (i.e., diffusion layers 26 and silicon redistribution planes 35, 35') has a multilayer design. In this case, a large difference in the lengths of the diffusion pads for cavern 10, 6 may be particularly advantageously achieved via suitable structuring. For example, large areas of redistribution plane 35' and of surrounding oxide layers 26 in cavern 10 may be removed in order to ensure short diffusion paths. By contrast, redistribution plane 35' for additional cavern 6 is designed as a virtually flat protection, which is interrupted only at a few points so that the gas transport into the cavern interior of additional cavern 6 is strongly impeded.

FIGS. 10, 11, 12, 13 and 14 show schematic process steps for manufacturing a semiconductor system, in particular, a wafer system, according to one specific embodiment of the present invention.

Figure 10:
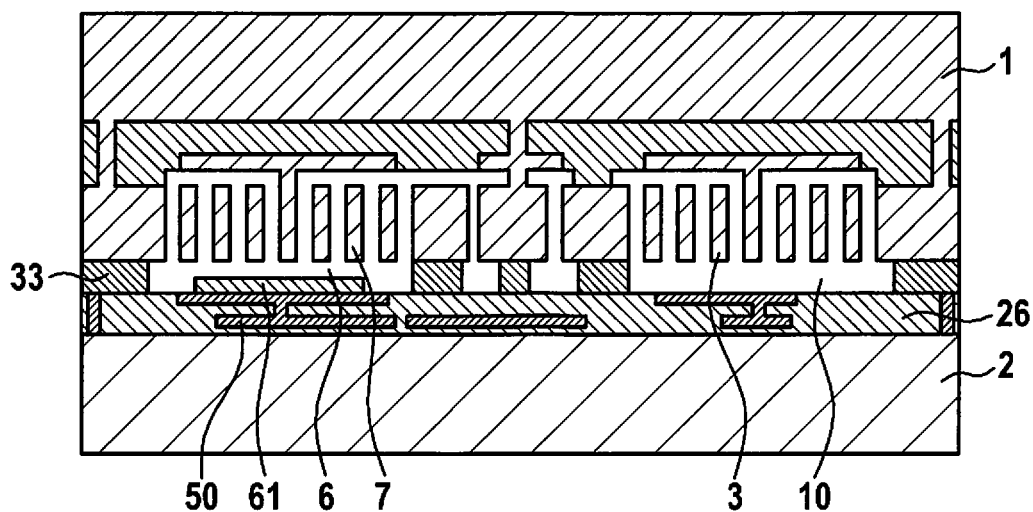
FIGS. 10, 11, 12, 13 and 14 schematically show process steps for manufacturing a semiconductor system, in particular, a wafer system, according to one specific embodiment of the present invention.

FIG. 10 shows a bonded wafer composite, including substrate cap 2 and substrate 1 with microelectromechanical systems 3, 7. Substrate cap 2 is designed as an ASIC. Substrate cap 2 and substrate 1 are connected by bonding frame 33 in such a way that two caverns 10, 6 are formed. A getter 61 may be situated in additional cavern 6. The (multilayer) diffusion layer 26 or oxide layer 26 is designed as part of substrate cap 2, in which metallization surfaces 50 of the CMOS wafer are situated. By using getter 61, it is possible to also achieve a comparatively good vacuum in small cavern volumes and when using so-called anti-stiction coatings (ASC) for additional cavern 6. ASC layers tend to outgas. Hence, the achievable vacuum levels may degrade during wafer bonding. This applies, in particular, in the case of very small cavern columns if, for example, a MEMS wafer is bonded on an ASIC wafer (as substrate cap 2), which includes no cavern recess. When using a getter 61, these undesirable outgas products may be effectively chemisorbed by getter 61.

It is possible that a getter is also used in cavern 10 (not depicted). As a result, it is advantageously possible to also reduce the influence of outgas products (for example, of wafer bonding, or by outgases of the CMOS wafer on which the MEMS wafer has been bonded) in cavern 10. The internal pressure is therefore subject to significantly fewer process variations (on the wafer, from wafer to wafer, from charge to charge). The getter in this case is used preferably not for setting the cavern internal pressure, but for pumping off non-inert gases.

Figure 11:
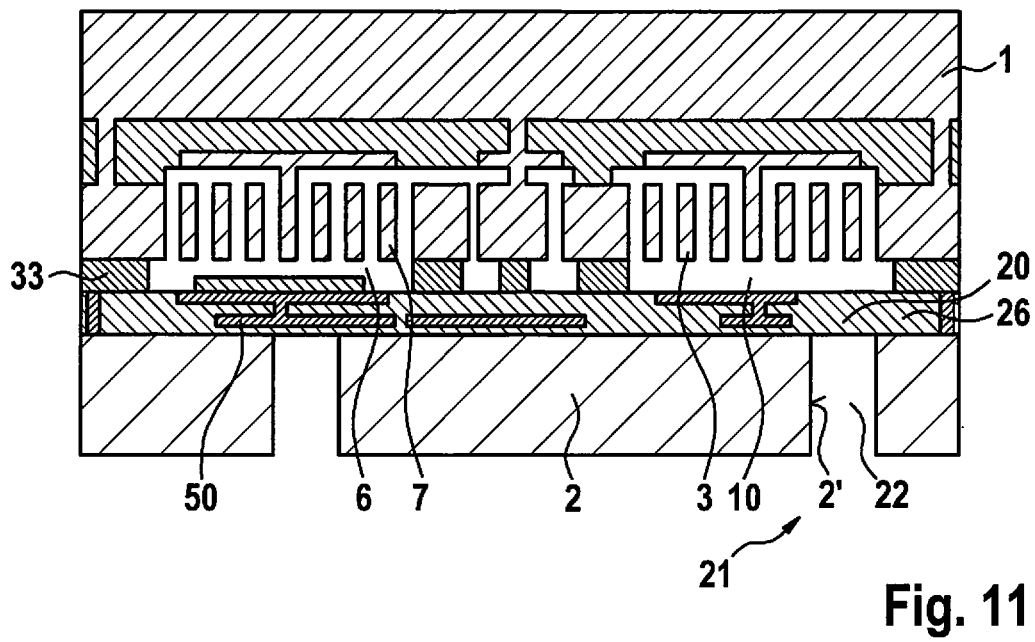
Figure 14:
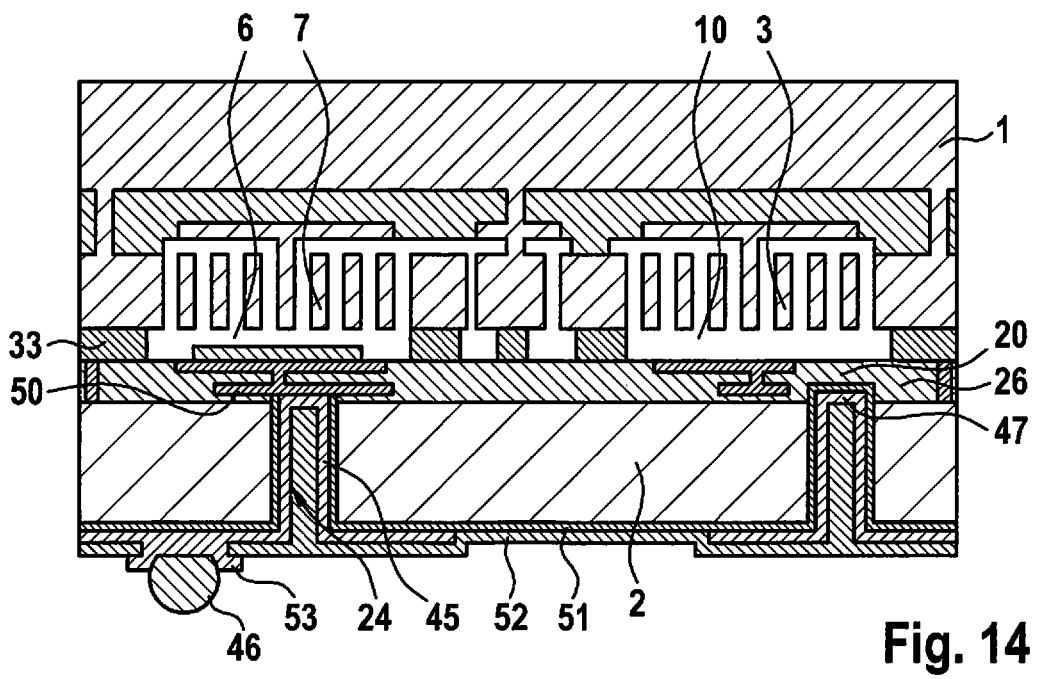

FIG. 11 depicts trenches formed in substrate cap 2, which are produced primarily for creating vias 24 (cf. FIG. 14). The trenches used for forming vias 24 are situated in this case below metallization surfaces 50, in order to later enable an electrical connection to such a metallization surface 50. Recess 22 is produced in substrate cap 2 in the area of cavern 10 in parallel to the formation of such trenches. Recess 22 exposes oxide layer 26 in diffusion area 20. Preferably no metal is situated in diffusion area 20 of oxide layer 26 in order not to inhibit the diffusion of gases into cavern 10. After exposure, diffusion area 20 connects the cavern interior of cavern 10 to a substrate cap surface 2' of substrate cap 2 facing surroundings 21. With the aid of diffusion area 20, it is possible for a gas filling of cavern 10, in particular, a filling with neon, to take place in the diffusion step.

Figure 12:
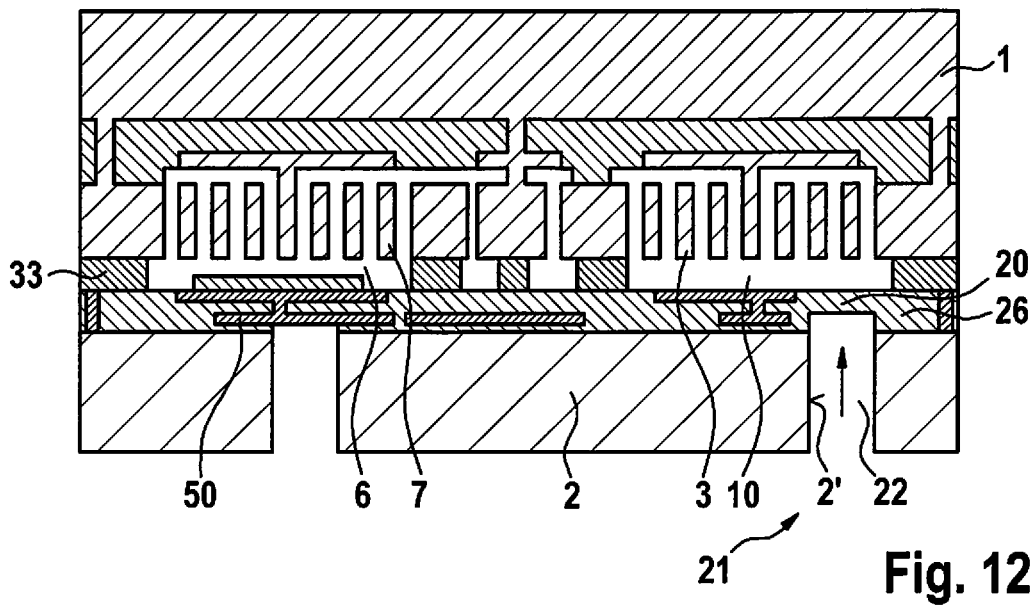

An optional oxide etching step is depicted in FIG. 12, which may be carried out, in particular, before the diffusion step. In this step, metallization surface 50 is exposed in such a way that a via 24 having electrical contact with metallization surface 50 may be subsequently formed. At the same time, oxide layer 26 and, therefore, diffusion layer 20 becomes thinned at recess 22, which shortens the diffusion path into cavern 10. Hereafter, the diffusion step and the gas filling of cavern 10 may be carried out at a particularly high diffusion rate (again indicated by the arrow in recess 22). The diffusion path into cavern 10, starting from recess 22, is significantly shorter than the diffusion paths into the interior of additional cavern 6, so that in the diffusion step, an internal pressure occurs in cavern 10, which is significantly higher than in additional cavern 6.

Figure 13:
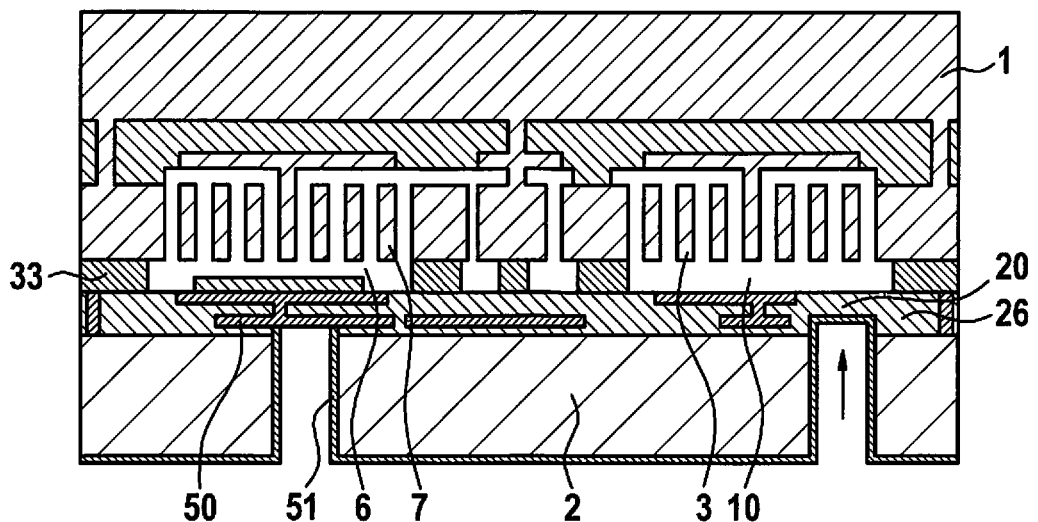

FIG. 13 depicts an oxide deposition for applying an oxide passivation 51 on the side walls of via 24. The passivation is subsequently removed on the bottom of the trenches in order to expose metallization surface 50 in the area of future via 24. The diffusion step and, therefore, the gas filling of cavern 10 may take place both before as well as after the oxide deposition depicted in FIG. 13.

Finally, FIG. 14 shows the finished component after metal deposition, structuring, passivation 52 (in which the trenches are also filled), as well as the arrangement of solder balls 46. As a result of the metal deposition, redistribution plane (RDL) 45, with the aid of which the electrical contact between metallization layer 50 and solder ball 46 is provided and which therefore contributes, in particular, to the formation of via 24. At the same time, diffusion area 20 is also hermetically sealed in the area of recess 22 as a result of the metal deposition (i.e., the deposition of the RDL), so that no back-diffusion from the cavern interior of cavern 10 outwardly may take place. Accordingly, via 24 is formed with the aid of the metal deposition and diffusion protection 47 is applied to diffusion area 20. Furthermore, an under bump metal 53 is situated in the area of solder ball 46.

Figure 15:
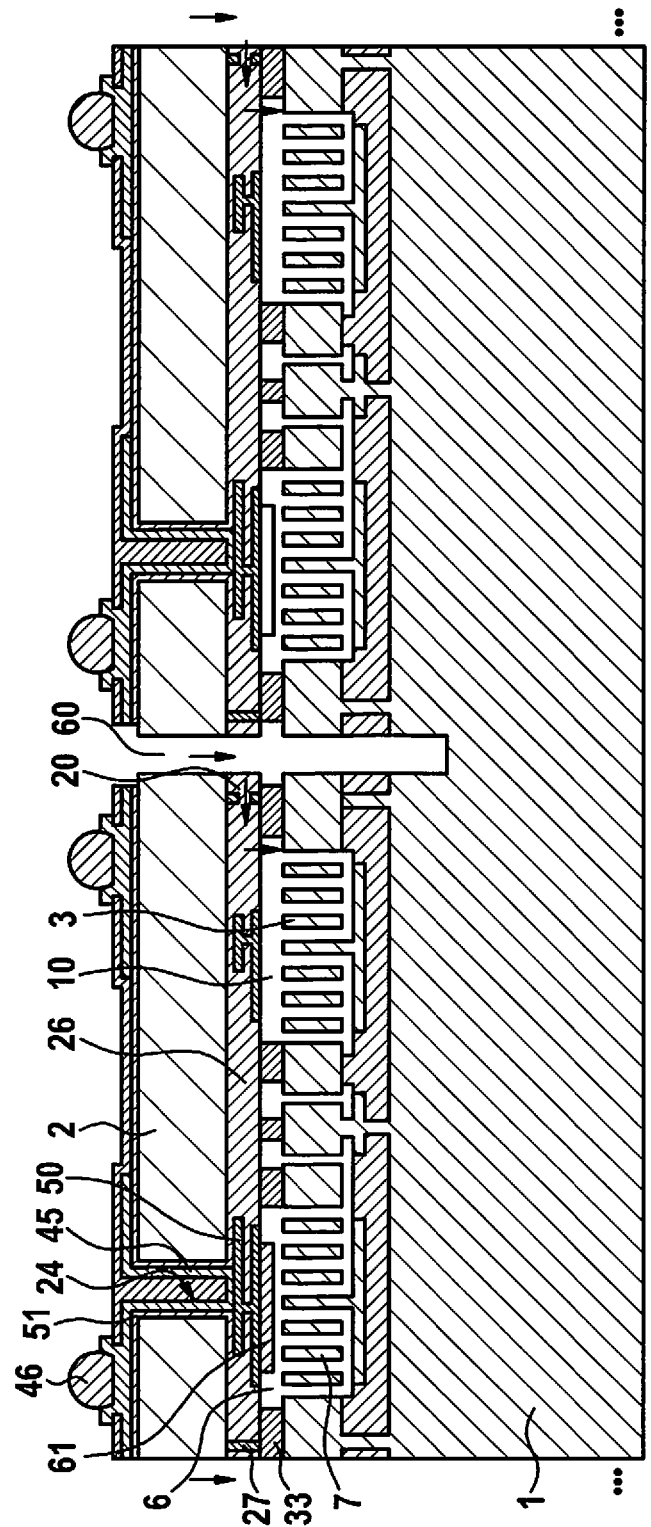
FIG. 15 shows a schematic representation of a semiconductor system, in particular, of a wafer system, according to one specific embodiment of the present invention.

FIG. 15 shows a schematic representation of a semiconductor system, in particular, of a wafer system, according to one specific embodiment of the present invention. Two chips are depicted by way of example, each of which includes a cavern 10 including a microelectromechanical system 3 and an additional cavern 6 including an additional microelectromechanical system 7. The arrangement may be extended arbitrarily to the right and left and accordingly may include additional caverns 10, 6. The arrangement is accordingly present as a wafer, i.e., still a composite. In this specific embodiment, the diffusion step is carried out only in a very late process stage during the separation of the chip. For this purpose, the wafer is partially sawed in a separation substep (in particular, in a sawing step), before the diffusion step, as a result of which a trench 60 formed as an ASIC is produced in substrate cap 2 (and, if necessary, partially in substrate 1). Trench 60 in this case may be understood within the context of the present invention to also mean recess 22. In the present specific embodiment, substrate cap 2 in this case is sawed completely. The sawing process may take place, in particular, mechanically using a rotating saw blade, with the aid of plasma cutting (plasma dicing) or laser cutting (laser dicing). In the case of plasma cutting or laser cutting, it is possible to open trenches 60, which do not extend over an entire chip edge. Thus, for example, individual holes may be produced in the area of the scribe lines, i.e., of the area between the individual use chips provided for separating the chips. Oxide surfaces in the side area of the chip are exposed via trench 60 or via the openings in the scribe line. Accordingly, trench 60 extends to diffusion area 20, which is situated in diffusion layer 26 of substrate cap 2, and thus exposes diffusion area 20. A diffusion stop barrier 27 is designed essentially as a circumferential metal ring or seal ring in oxide layer 26 of the ASIC. The metal ring also prevents the propagation of cracks in the metal-oxide microstructure of the CMOS-ASIC. In diffusion area 20, however, the metal ring or diffusion stop barrier 27 has a break. By situating oxide instead of metal at this breakpoint, it is possible for a diffusion of neon through the oxide layers of the ASIC into cavern 10 to take place. The diffusion path through the diffusion area 20 is indicated by the arrows. Additional cavern 6 on the other hand is protected from a gas diffusion by the metal ring. The diffusion step in this case takes place advantageously after the separation substep, i.e., after the formation of trench 60. After the diffusion step, the separation may then be completed and trench 60 may be deepened in such a way that it severs entire substrate 1 (not depicted).

Figure 16:
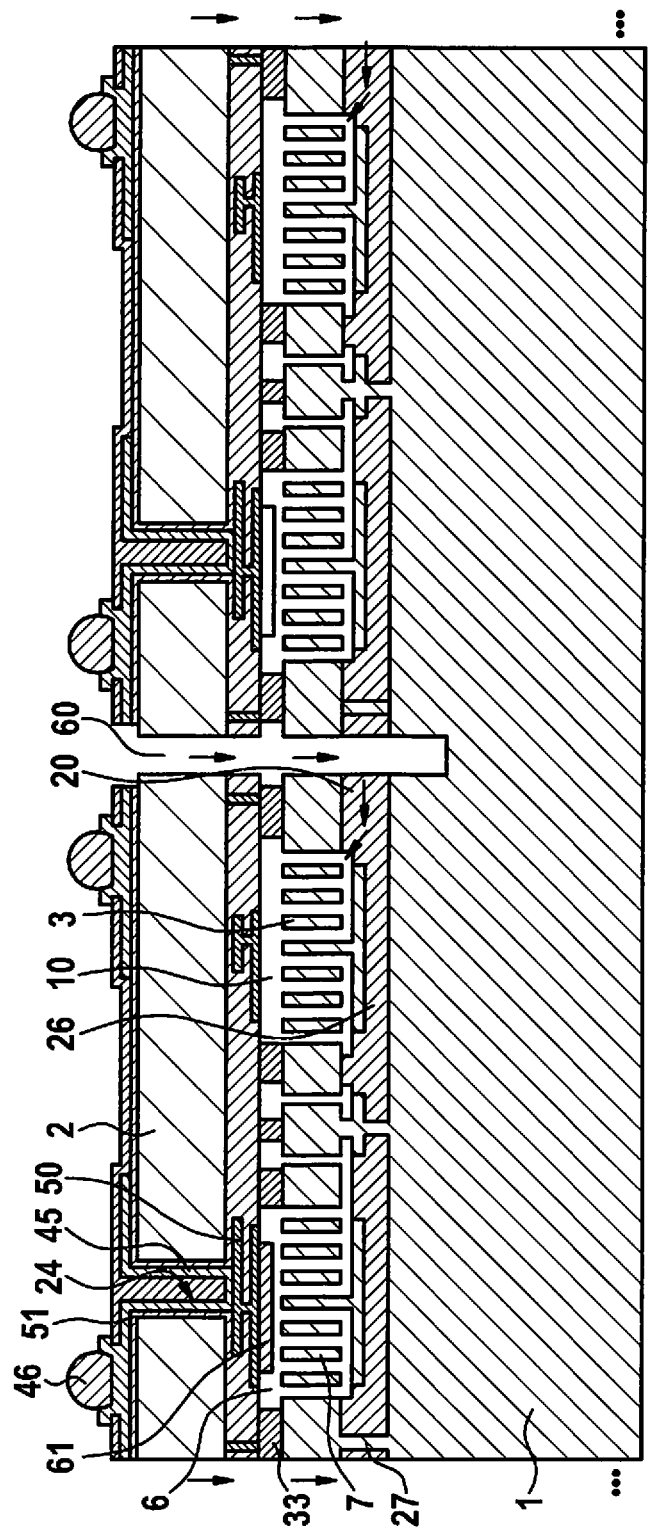
FIG. 16 shows a schematic representation of a semiconductor system, in particular, of a wafer system, according to one specific embodiment of the present invention.

FIG. 16 shows a schematic representation of a semiconductor system, in particular, of a wafer system, according to one specific embodiment of the present invention. In this case, the specific embodiment depicted in FIG. 16 resembles the specific embodiment depicted in FIG. 15. In the specific embodiment depicted in FIG. 16, however, the diffusion does not take place through the ASIC or substrate cap 2, since the metal ring in this specific embodiment has no break and accordingly is fully intact. Instead, the diffusion takes place with the aid of diffusion layers 26 of substrate 1 or of the MEMS element. For this purpose, diffusion area 20 is present in diffusion layer 26 of substrate 1 adjacent to trench 60. Diffusion area 20 connects the interior of cavern 10 without any breaks to trench 60. For additional cavern 6 on the other hand, a diffusion stop barrier 27 is present, which prevents a penetration of gas into additional cavern 6. The diffusion path through diffusion area 20 is again depicted by the arrows. As in the specific embodiment depicted in FIG. 15, the diffusion step takes place after the separation substep, in which trench 60 is formed. Here, too, it is possible that the diffusion paths are shortened significantly by the additional creation of gas channels in the surface micromechanical layers of the MEMS element or of substrate 1.

FIGS. 17, 18, 19, 20 and 21 schematically show process steps for manufacturing a semiconductor system, in particular, a wafer system, according to one specific embodiment of the present invention.

Figure 17:
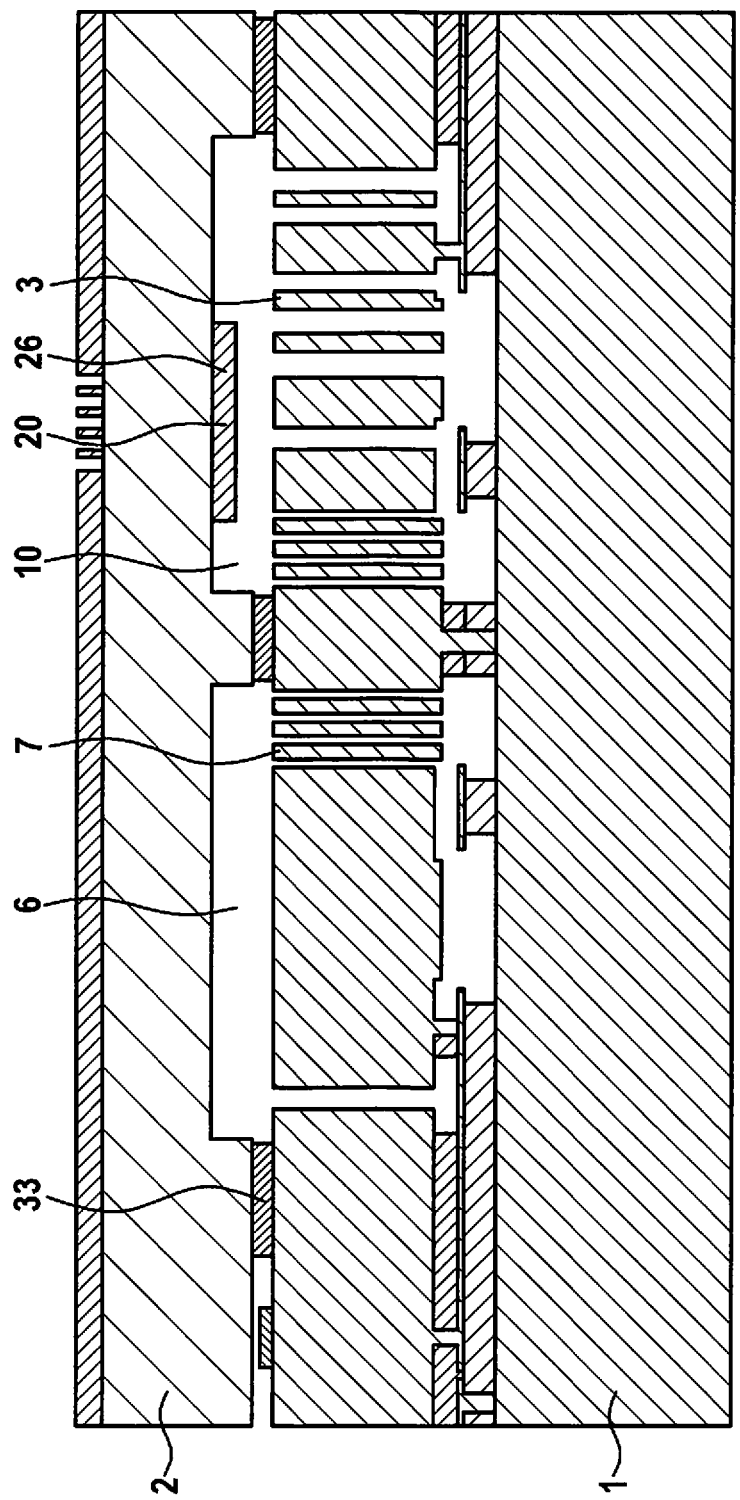
FIGS. 17, 18, 19, 20 and 21 schematically show process steps for manufacturing a semiconductor system, in particular, a wafer system, according to one specific embodiment of the present invention.

FIG. 17 shows substrate 1 connected to substrate cap 2 with the aid of bonding frame 33. Cavern 10 includes microelectromechanical system 3 and additional cavern 6 includes additional microelectromechanical system 7. An oxide layer 26 is situated on substrate cap 2 on the cavern interior side of cavern 10, which is subsequently used as a diffusion layer for the neon filling. An oxide layer is deposited on the cap outer side of substrate cap 2, and is structured in the form of an oxide lattice.

Figure 18:
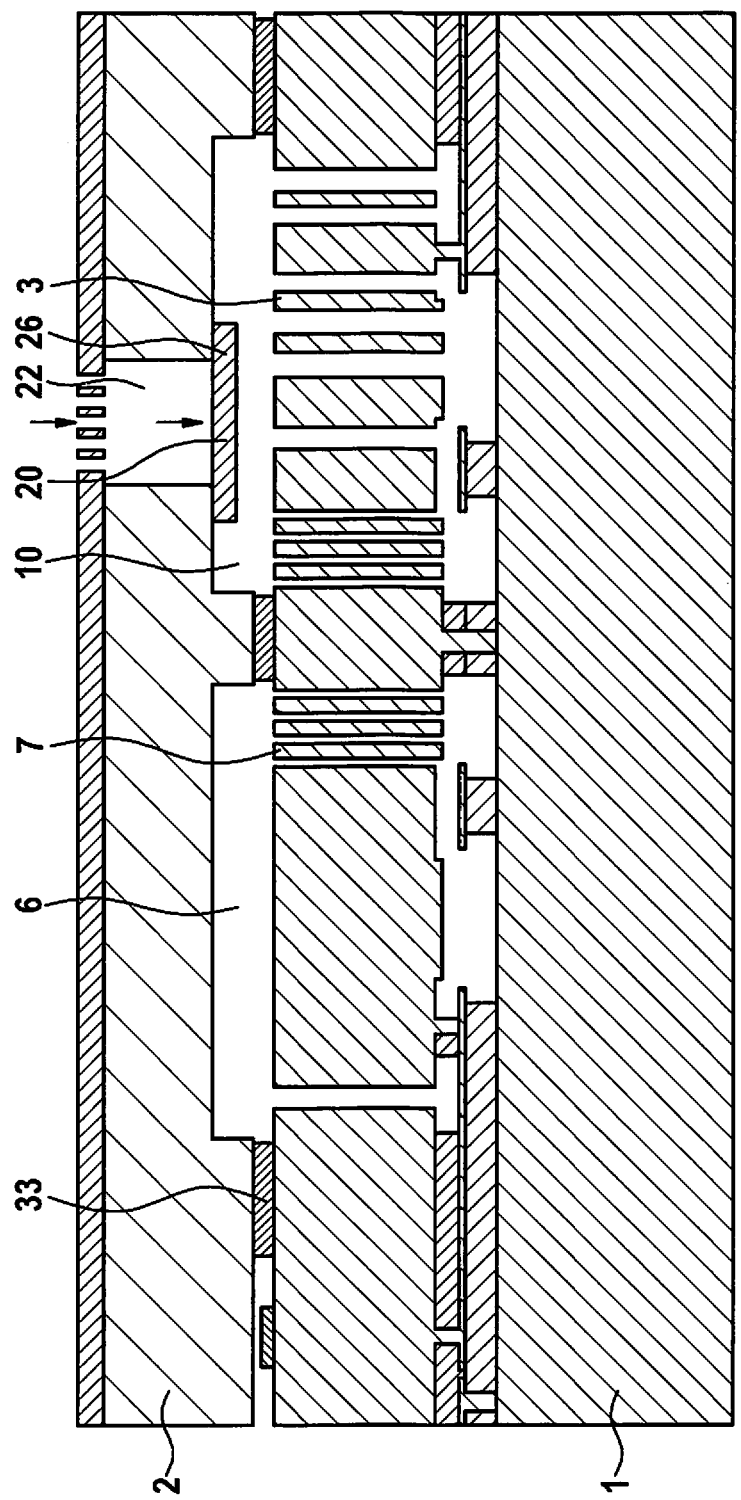

FIG. 18 shows the system after a trenching process, in which a recess 22 has been produced in substrate cap 2 with the aid of the oxide lattice. Recess 22 extends to and exposes diffusion area 20. The diffusion step may be subsequently carried out. The gas diffusion into cavern 10 is illustrated by the arrows.

Figure 19:
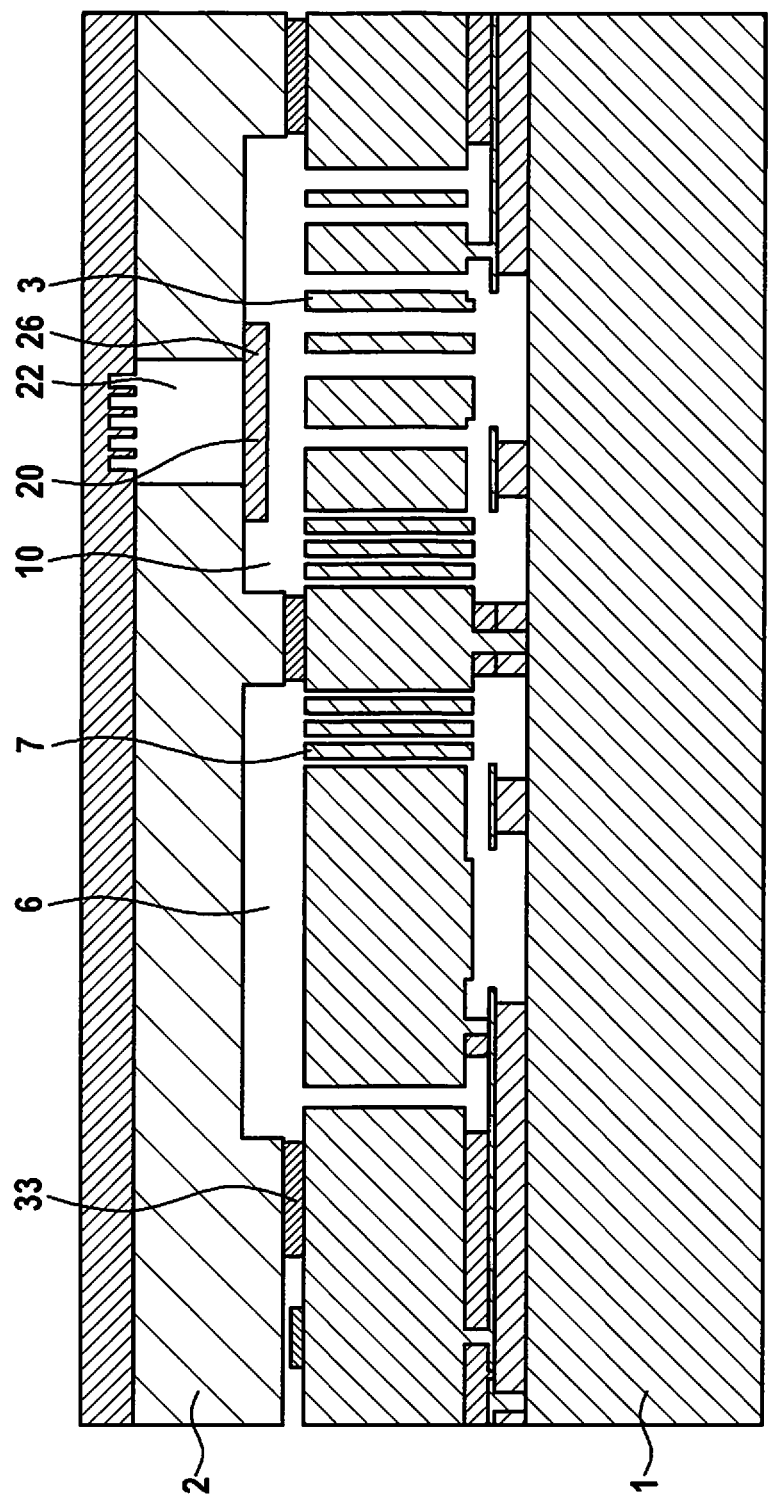
Figure 20:
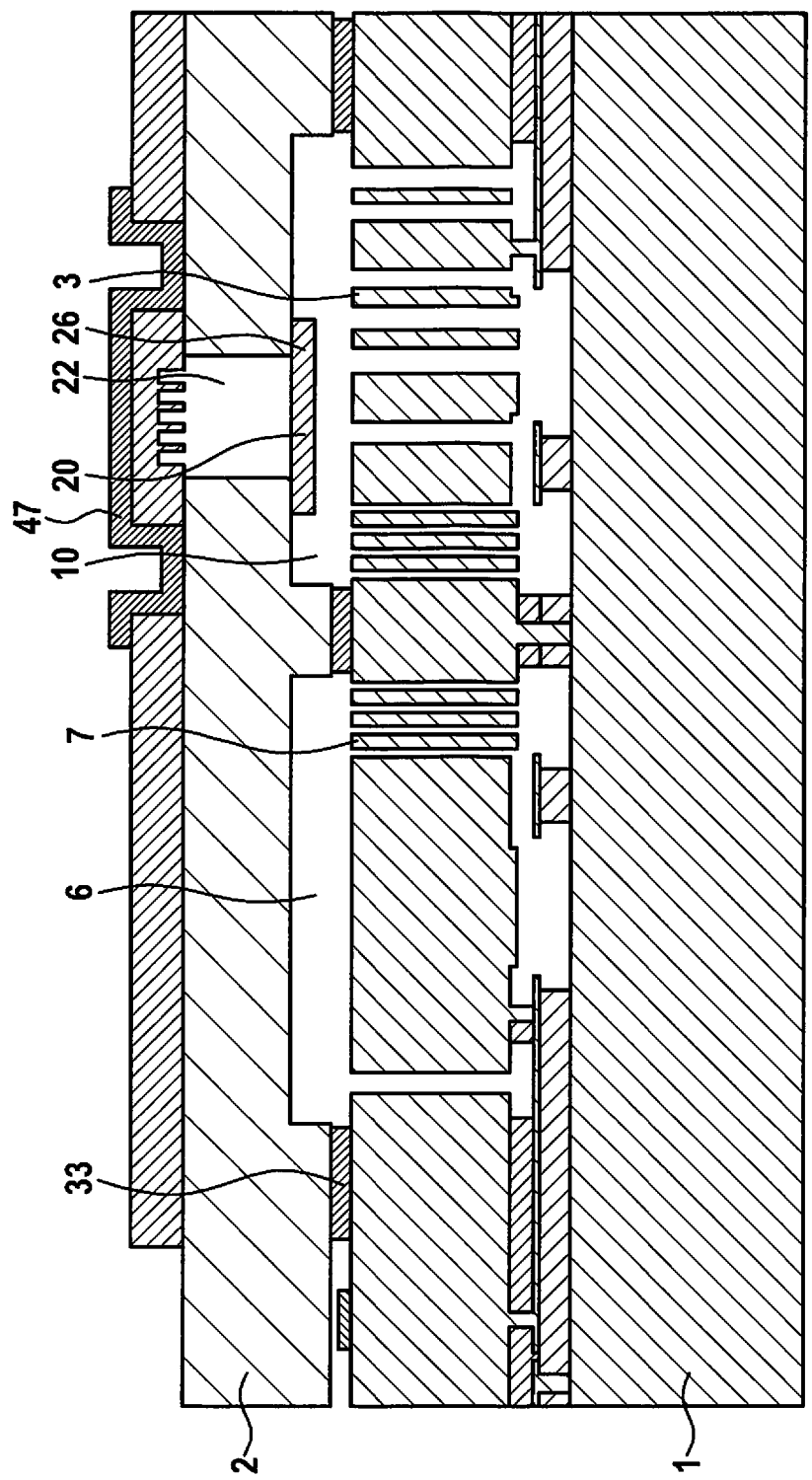

FIG. 19 shows the subsequent sealing of the oxide lattice. A structuring of the oxide layer and the arrangement of a metal layer for tightly sealing the diffusion access may optionally subsequently take place, as depicted in FIG. 20. The metal layer in this case forms a diffusion protection 47, in particular, above recess 22. The metal deposition and structuring are optional. In many cases, these steps may be dispensed with under normal operating conditions of the sensor elements.

Figure 21:
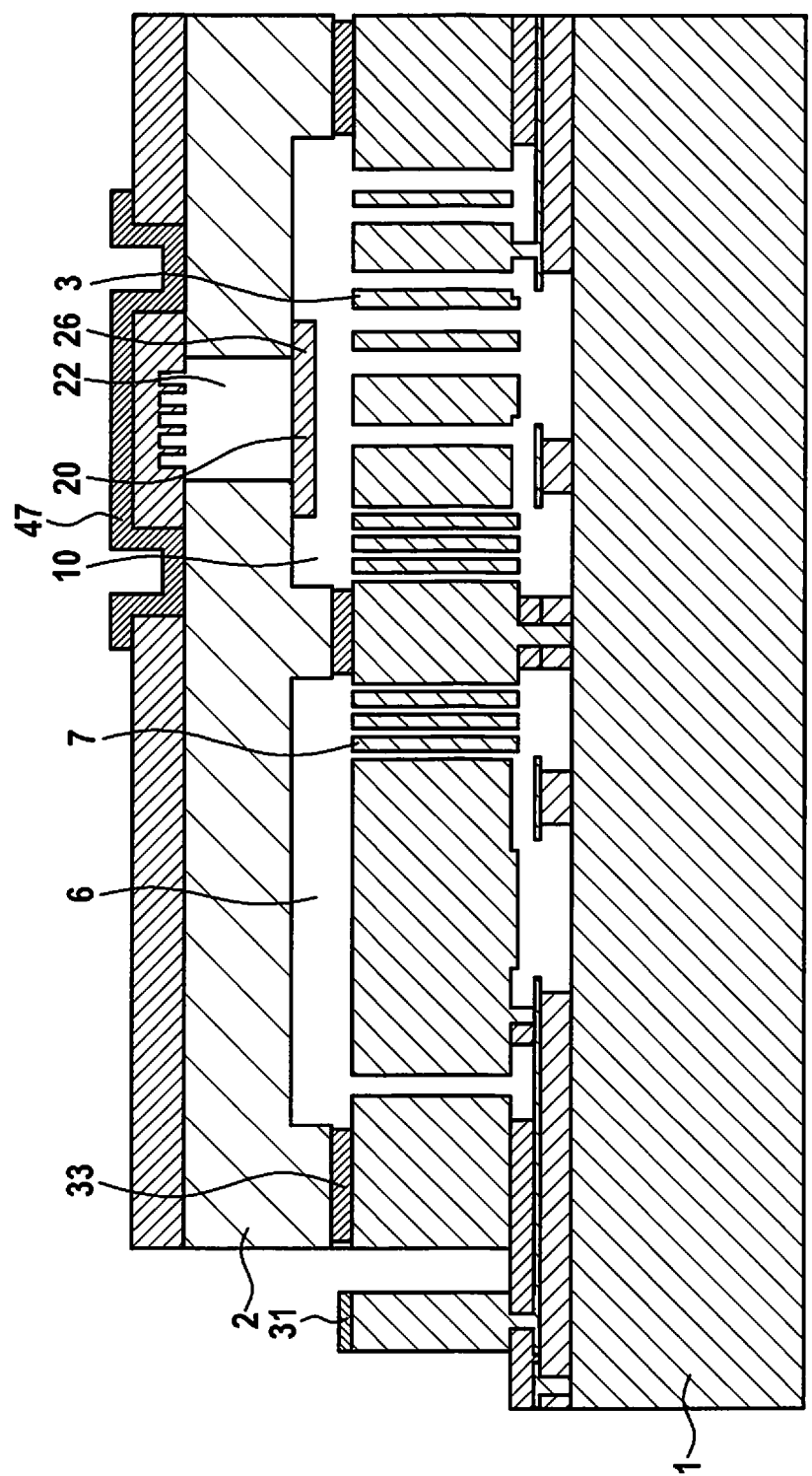

FIG. 21 depicts the subsequent formation of a bonding pad 31 for electrical contacting.

FIGS. 22, 23, 24 and 25 schematically show process steps for manufacturing a semiconductor system, in particular, a wafer system, according to one specific embodiment of the present invention. In this case, the neon diffusion takes place with the aid of vias 24 situated in substrate cap 2.

Figure 22:
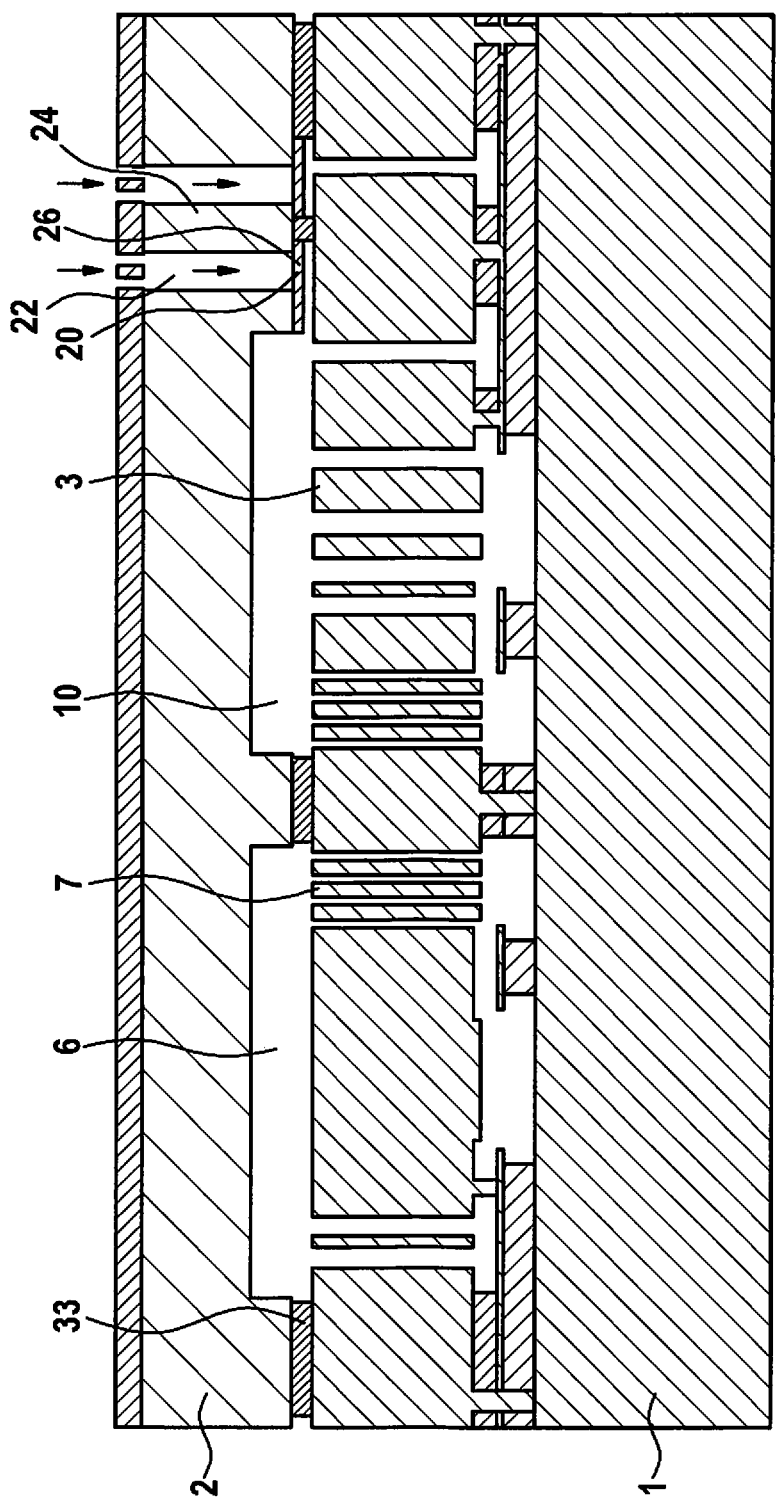
FIGS. 22, 23, 24 and 25 schematically show process steps for manufacturing a semiconductor system, in particular, a wafer system, according to one specific embodiment of the present invention.

In this case, FIG. 22 shows the wafer composite made of substrate 1 and substrate cap 2 after bonding. An oxide layer including an oxide lattice has been applied on the upper side of the substrate cap in the area of subsequent via 24. A recess 22, which also serves as an insulation trench for via 24, is etched using the oxide lattice. Recess 22 ends on a diffusion layer 26 (or oxide layer) situated on the inner side of the substrate cap. The neon diffusion into cavern 10 may then take place through diffusion area 20 of diffusion layer 26.

Figure 23:
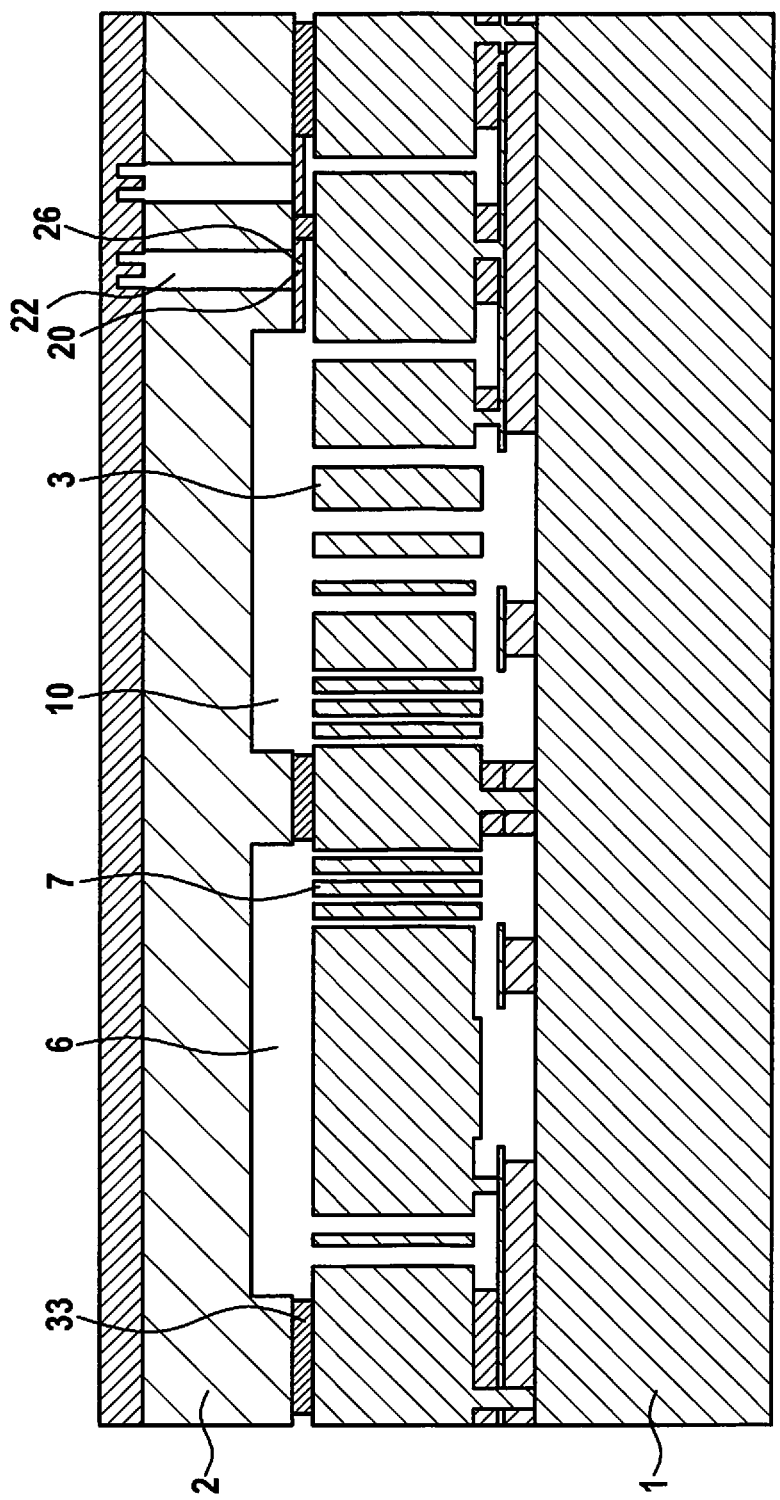
Figure 24:
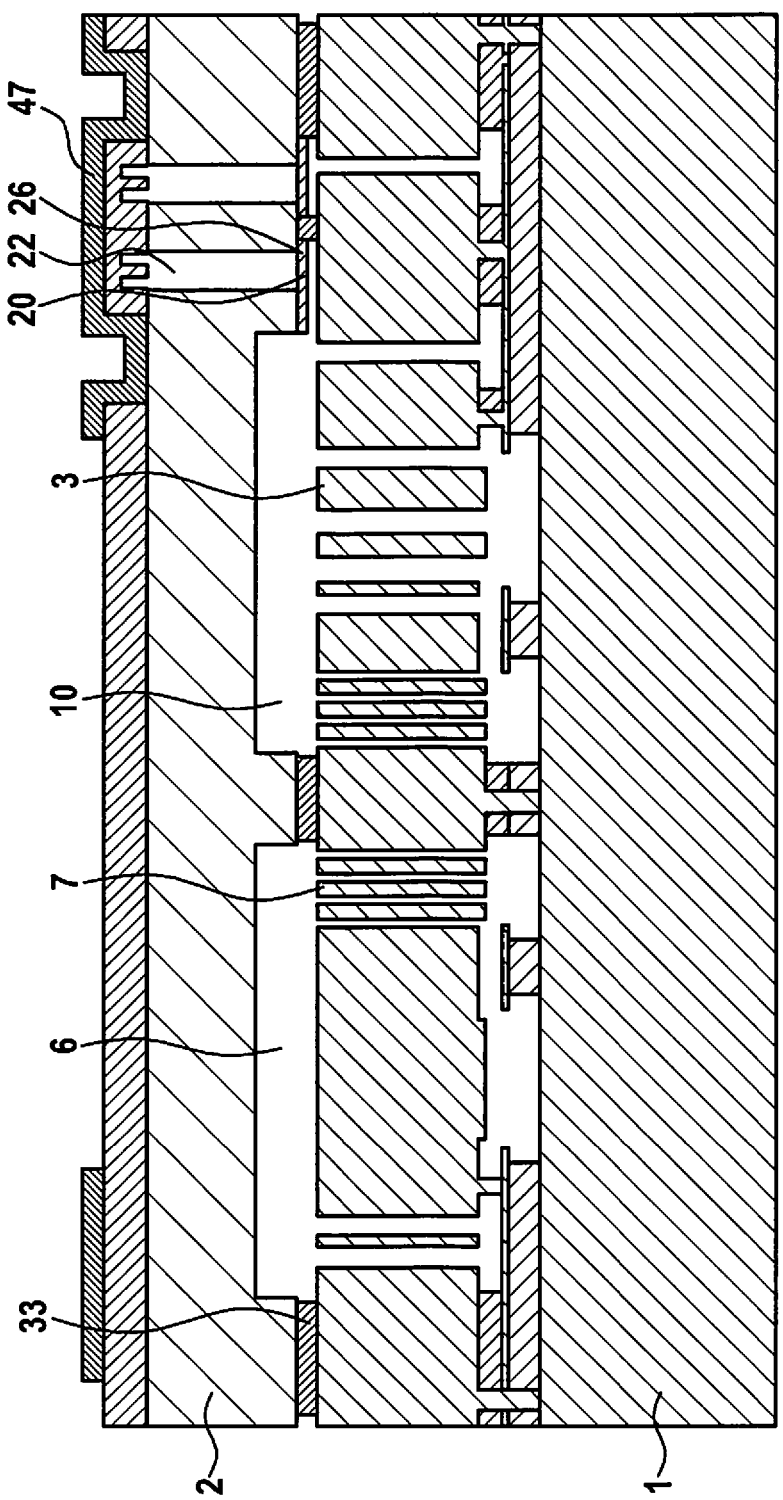
Figure 25:
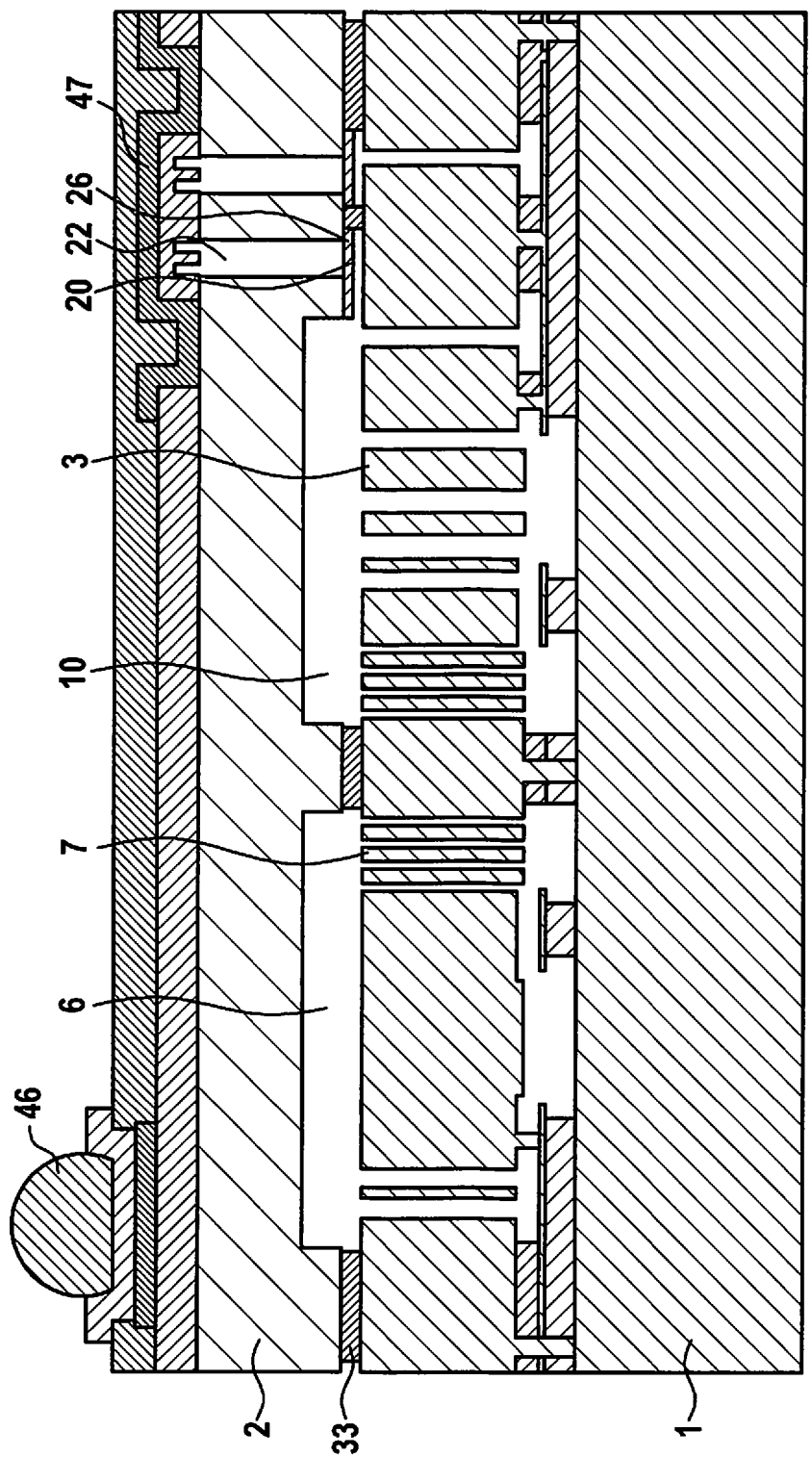

A process sequence including oxide sealing/passivation (FIG. 23), oxide structuring and metal deposition/metal structuring (FIG. 24), as well as passivation, UBM and balling (FIG. 25) may subsequently take place, as depicted in FIGS. 23 through 25.

Specific embodiments have been depicted in FIGS. 1 through 25, in which in the diffusion step a gas diffuses from surroundings 21 into cavern 10 with the aid of diffusion area 20, during the diffusion step a diffusivity and/or a diffusion flow of the gas from surroundings 21 into cavern 10 being greater than an additional diffusivity and/or an additional diffusion flow of the gas from surroundings 21 into additional cavern 6, and/or during the diffusion step, additional cavern 6 is at least essentially protected from a penetration of the gas into additional cavern 6.

According to the present invention, it is alternatively possible, however, that in the diffusion step a gas diffuses from cavern 10 into surroundings 21 with the aid of diffusion area 20, during the diffusion step a diffusivity and/or a diffusion flow of the gas from cavern 10 into surroundings 21 being greater than an additional diffusivity and/or an additional diffusion flow of the gas from additional cavern 6 into surroundings 21, and/or during the diffusion step additional cavern 6 is at least essentially protected from an escape of gas into surroundings 21. In this case, an evacuation (or reduction of internal pressure) of cavern 10 may be undertaken in the diffusion step. In this case, it is, in particular, possible that both sensor caverns 6, 10 are filled with a gas, preferably neon, during wafer bonding. Subsequently, the neon may escape at increased temperatures in the diffusion step from cavern 10 (for example, cavern 10 of a rotational rate sensor) connected to surroundings 21 with the aid of diffusion area 20. In principle, this diffusion step is possible, even with a tempering of air or nitrogen at atmospheric pressure, since the partial neon pressures attempt to equalize. The rate of the diffusion process is proportional to the difference in pressure and therefore becomes continually slower as the internal pressure decreases. This method (of evacuating cavern 10 during the diffusion step) may therefore be used, in particular, if a small internal pressure difference in caverns 10, 6 is desired, for example, in order to equalize the damping of two channels of an x-z acceleration sensor situated in two separate caverns 10, 6. Here, it would be possible, for example, to carry out the wafer bonding at 300 mbar (optimal pressure for the x-channel) and to subsequently lower the internal pressure of cavern 10 to 200 mbar for the z-channel by expelling the neon with the aid of a diffusion area 20. It may be a technical advantage with respect to the subsequent filling process that the tempering oven (in which the diffusion step is carried out) requires no supply of neon gas. Instead, the wafer bonder in this specific embodiment must be acted upon by neon.

What is claimed is:

1. A method for setting a pressure in a cavern formed using a substrate and a substrate cap, the cavern being part of a semiconductor system, the semiconductor system being a wafer system, the semiconductor system including an additional cavern formed using the substrate and the substrate cap, a microelectromechanical system being situated in the cavern, an additional microelectromechanical system being situated in the additional cavern, the method comprising the following diffusion step:
a gas diffusing from surroundings into the cavern;
wherein:
at least one diffusion layer separates the cavern and the additional cavern from the surroundings;
the at least one diffusion layer forms a first diffusion path from the surroundings to the cavern and a second diffusion path from the surroundings to the additional cavern; and
a via from the surroundings extends to and exposes a region of the at least one diffusion layer, thereby shortening (a) a length of a path from the surroundings to the first diffusion path so that the length of the path from the surroundings to the first diffusion path is shorter than a length of a path from the surroundings to the second diffusion path and/or (b) a length of the first diffusion path so that the first diffusion path is shorter than the second diffusion path, so that, due to the shortening, during the diffusion step, a diffusivity and/or a diffusion flow of the gas from the surroundings into the cavern is greater than an additional diffusivity and/or an additional diffusion flow of the gas from the surroundings into the additional cavern.

2. The method as recited in claim 1, wherein the first diffusion path is made up of an oxide through which the gas diffuses into the cavern during the diffusing step by passing from the surroundings into the via, then from the via into the oxide, and then from the oxide into the cavern.

3. The method as recited in claim 1, wherein the first diffusion path, at least during the diffusion step, connects the cavern to a surface of the substrate facing the surroundings and/or to a surface of the substrate cap facing the surroundings.

4. The method as recited in claim 1, further comprising, before the diffusion step, producing the via in the substrate on a substrate surface facing the surroundings and/or in the substrate cap on a substrate cap surface facing the surroundings.

5. The method as recited in claim 4, wherein the production of the via takes place during an etching step in which a through silicon via is also produced.

6. The method as recited in claim 5, wherein an electrical insulation of the through silicon via is formed with the aid of the via.

7. The method as recited in claim 1, wherein a channel is formed in the substrate or in the substrate cap adjacent to the diffusion path, the gas passing in the diffusion step from the surroundings into the cavern with the aid of the diffusion path and of the channel.

8. The method as recited in claim 1, wherein the substrate cap is an application-specific integrated circuit (ASIC) wafer.

9. The method as recited in claim 1, wherein the at least one diffusion layer is arranged at the substrate or the substrate cap and is formed as at least one oxide layer.

10. The method as recited in claim 9, wherein a diffusion stop barrier is arranged in the at least one diffusion layer protecting against diffusion of gas between the first and second paths.

11. The method as recited in claim 1, further comprising, after the diffusion step, sealing the via with a diffusion protection.

12. A method for setting a pressure in a cavern formed using a substrate and of a substrate cap, the cavern being part of a semiconductor system, the semiconductor system being a wafer system, the semiconductor system including an additional cavern formed using the substrate and the substrate cap, a microelectromechanical system being situated in the cavern, an additional microelectromechanical system being situated in the additional cavern, a diffusion area being situated in the substrate and/or in the substrate cap, the method comprising the following diffusion step:
a gas diffusing with the aid of the diffusion area from the cavern into the surroundings;
wherein:
at least one diffusion layer separates the cavern and the additional cavern from the surroundings;
the at least one diffusion layer forms a first diffusion path from the surroundings to the cavern and a second diffusion path from the surroundings to the additional cavern; and
a via from the surroundings extends to and exposes a region of the at least one diffusion layer, thereby shortening (a) a length of a path from the surroundings to the first diffusion path so that the length of the path from the surroundings to the first diffusion path is shorter than a length of a path from the surroundings to the second diffusion path and/or (b) a length of the first diffusion path so that the first diffusion path is shorter than the second diffusion path, so that, due to the shortening, during the diffusion step, a diffusivity and/or a diffusion flow of the gas from the cavern into the surroundings is greater than an additional diffusivity and/or an additional diffusion flow of the gas from the additional cavern into the surroundings.

13. The method as recited in claim 12, wherein the first diffusion path is made up of an oxide into which the gas diffuses from the cavern during the diffusing step to then escape to the surroundings by passing from the oxide into the via and then from the via to the surroundings.

14. The method as recited in claim 12, wherein the first diffusion path, at least during the diffusion step, connects the cavern to a surface of the substrate facing the surroundings and/or to a surface of the substrate cap facing the surroundings.

15. The method as recited in claim 12, further comprising, before the diffusion step, producing the via in the substrate on a substrate surface facing the surroundings and/or in the substrate cap on a substrate cap surface facing the surroundings.

16. The method as recited in claim 15, wherein the production of the via takes place during an etching step in which a through silicon via is also produced.

17. The method as recited in claim 16, wherein an electrical insulation of the through silicon via is formed with the aid of the via.

18. The method as recited in claim 12, wherein a channel is formed in the substrate or in the substrate cap adjacent to the diffusion path, the gas passing in the diffusion step from the cavern into the surroundings with the aid of the diffusion path and of the channel.

19. The method as recited in claim 12, wherein the substrate cap is an application-specific integrated circuit (ASIC) wafer.

20. The method as recited in claim 12, wherein the at least one diffusion layer is arranged at the substrate or the substrate cap and is formed as at least one oxide layer.

21. The method as recited in claim 20, wherein a diffusion stop barrier is arranged in the at least one diffusion layer protecting against diffusion of gas between the first and second paths.

22. The method as recited in claim 12, further comprising, after the diffusion step, sealing the via with a diffusion protection.

23. A semiconductor system, comprising:
a substrate; and
a substrate cap, a cavern being formed by the substrate and the substrate cap, and an additional cavern being formed by the substrate and the substrate cap;
a microelectromechanical system situated in the cavern;
an additional microelectromechanical system situated in the additional cavern; and
at least one diffusion layer that separates the cavern and the additional cavern from the surroundings;
wherein:
the at least one diffusion layer forms a first diffusion path from the surroundings to the cavern and a second diffusion path from the surroundings to the additional cavern; and
a via from the surroundings extends to and exposes a region of the at least one diffusion layer, thereby shortening (a) a length of a path from the surroundings to the first diffusion path so that the length of the path from the surroundings to the first diffusion path is shorter than a length of a path from the surroundings to the second diffusion path and/or (b) a length of the first diffusion path so that the first diffusion path is shorter than the second diffusion path, so that, due to the shortening, a diffusivity and/or a diffusion flow of gas from the surroundings into the cavern is greater than an additional diffusivity and/or an additional diffusion flow of the gas from the surroundings into the additional cavern.

24. A semiconductor system, comprising:
a substrate;
a substrate cap, a cavern being formed by the substrate and the substrate cap, and an additional cavern being formed by the substrate and the substrate cap;
a microelectromechanical system situated in the cavern;
an additional microelectromechanical system situated in the additional cavern; and
at least one diffusion layer that separates the cavern and the additional cavern from the surroundings;
wherein:
the at least one diffusion layer forms a first diffusion path from the surroundings to the cavern and a second diffusion path from the surroundings to the additional cavern; and
a via from the surroundings extends to and exposes a region of the at least one diffusion layer, thereby shortening (a) a length of a path from the surroundings to the first diffusion path so that the length of the path from the surroundings to the first diffusion path is shorter than a length of a path from the surroundings to the second diffusion path and/or (b) a length of the first diffusion path so that the first diffusion path is shorter than the second diffusion path, so that, due to the shortening, a diffusivity and/or a diffusion flow of gas from the cavern into the surroundings is greater than an additional diffusivity and/or an additional diffusion flow of the gas from the additional cavern into the surroundings.

* * * * *